(12) United States Patent
Jaiswal et al.

(10) Patent No.: US 11,069,402 B1
(45) Date of Patent: Jul. 20, 2021

(54) INTEGRATED PIXEL AND THREE-TERMINAL NON-VOLATILE MEMORY CELL AND AN ARRAY OF CELLS FOR DEEP IN-SENSOR, IN-MEMORY COMPUTING

(71) Applicant: GLOBALFOUNDRIES U.S. Inc., Malta, NY (US)

(72) Inventors: Akhilesh Jaiswal, Falls Church, VA (US); Ajey Poovannummoottil Jacob, Watervliet, NY (US)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 0 days.

(21) Appl. No.: 16/820,801

(22) Filed: Mar. 17, 2020

(51) Int. Cl.
*G11C 11/42* (2006.01)
*G06F 17/16* (2006.01)
(Continued)

(52) U.S. Cl.
CPC ............. *G11C 11/42* (2013.01); *G06F 17/16* (2013.01); *G11C 11/223* (2013.01);
(Continued)

(58) Field of Classification Search
CPC .............. G11C 11/223; G11C 16/0416; G11C 16/0466; G11C 11/42; G11C 11/2255; G11C 11/2257; G11C 11/2273; G11C 11/2275; G11C 16/0433; G11C 16/08; G11C 16/10; G11C 16/24; H01L 27/146; H01L 27/14643; H04N 3/155;
(Continued)

(56) References Cited

U.S. PATENT DOCUMENTS 7,119,745 B2   10/2006   Gaucher et al.
7,514,716 B2   4/2009   Panicacci
(Continued)

FOREIGN PATENT DOCUMENTS

WO   95/06288 A23   3/1995
WO   2011/133693 A2   10/2011

OTHER PUBLICATIONS

Coath et al., "Advanced Pixel Architectures for Scientific Image Sensors", Research Gate, 2009, pp. 57-61, https://www.researchgate.net/publication/265117870.
(Continued)

*Primary Examiner* — Son L Mai
(74) *Attorney, Agent, or Firm* — Gibb & Riley, LLC

(57) ABSTRACT

Disclosed is a cell that integrates a pixel and a three-terminal non-volatile memory device. The cell can be selectively operated in write, read and functional computing modes. In the write mode, a first data value is stored in the memory device. In the read mode, it is read from the memory device. In the functional computing mode, the pixel captures a second data value and a sensed change in an electrical parameter (e.g., voltage or current) on a bitline connected to the cell is a function of both the first and second data value. Also disclosed is an IC structure that includes an array of the cells and, when multiple cells in a given column are concurrently operated in the functional computing mode, the sensed total change in the electrical parameter on the bitline for the column is indicative of a result of a dot product computation.

20 Claims, 17 Drawing Sheets

(51) Int. Cl.
*G11C 11/22* (2006.01)
*G11C 16/24* (2006.01)
*G11C 16/04* (2006.01)
*G11C 16/08* (2006.01)
*G11C 16/10* (2006.01)
*G11C 16/26* (2006.01)

(52) U.S. Cl.
CPC ...... *G11C 11/2255* (2013.01); *G11C 11/2257* (2013.01); *G11C 11/2273* (2013.01); *G11C 11/2275* (2013.01); *G11C 16/0433* (2013.01); *G11C 16/0466* (2013.01); *G11C 16/08* (2013.01); *G11C 16/10* (2013.01); *G11C 16/24* (2013.01); *G11C 16/26* (2013.01)

(58) Field of Classification Search
CPC .... H04N 5/335; H04N 5/3355; H04N 5/3745; H04N 5/37452
USPC .................................. 365/185.01, 145, 215
See application file for complete search history.

(56) References Cited

U.S. PATENT DOCUMENTS

| | | | |
|---|---|---|---|
| 7,586,076 B2 * | 9/2009 | Silsby | H04N 5/3745 |
| | | | 250/208.1 |
| 7,965,330 B2 * | 6/2011 | Panicacci | H04N 5/341 |
| | | | 348/308 |
| 8,018,384 B2 | 9/2011 | Floyd et al. | |
| 8,816,929 B2 | 8/2014 | Kam et al. | |
| 8,854,517 B2 * | 10/2014 | Honda | H04N 5/3765 |
| | | | 348/308 |
| 9,041,694 B2 | 5/2015 | Nurmi et al. | |
| 9,287,302 B2 * | 3/2016 | Egawa | H04N 9/045 |
| 9,293,489 B2 * | 3/2016 | Lee | H01L 27/1464 |
| 9,961,284 B2 * | 5/2018 | Koga | H01L 27/14645 |
| 10,127,964 B2 | 11/2018 | Sun et al. | |
| 10,147,367 B2 | 12/2018 | Tan et al. | |
| 10,270,993 B2 * | 4/2019 | Honda | H01L 27/14634 |
| 10,355,051 B2 * | 7/2019 | Keel | H01L 27/1461 |
| 10,529,755 B2 * | 1/2020 | Lee | H01L 27/14667 |
| 2004/0085463 A1 * | 5/2004 | Sharma | H04N 5/335 |
| | | | 348/231.99 |
| 2010/0238310 A1 * | 9/2010 | Shizukuishi | H01L 27/14643 |
| | | | 348/220.1 |
| 2012/0038604 A1 | 2/2012 | Liu et al. | |
| 2012/0212384 A1 | 8/2012 | Kam et al. | |
| 2013/0075593 A1 | 3/2013 | Williams, Jr. | |
| 2014/0198072 A1 | 7/2014 | Schuele et al. | |
| 2018/0366476 A1 | 12/2018 | Liu | |

OTHER PUBLICATIONS

George et al., "Nonvolatile Memory Design Based on Ferroelectric FETs", 53nd ACM/EDAC/IEEE Design Automation Conference (DAC), IEEE, 2016, pp. 1-6.

Krestinskaya et al., "Real-time Analog Pixel-to-pixel Dynamic Frame Differencing with Memristive Sensing Circuits", IEEE Sensors, 2018, pp. 1-4.

Lee et al., "R-MRAM: A ROM-Embedded STT MRAM Cache", IEEE Electron Device Letters, vol. 34, No. 10, 2013, pp. 1256-1258.

Long et al., "A Ferroelectric FET Based Processing-in-Memory Architecture for DNN Acceleration", IEEE Journal on Exploratory Solid-State Computational Devices and Circuits, 2019, pp. 1-7.

Olumodeji et al., "Memristor-Based Pixel for Event-Detection Vision Sensor", IEEE Sensors, 2015, pp. 1-4.

Smagulova et al., "CMOS-Memristor Hybrid Integrated Pixel Sensors", IEEE International Symposium on Nanoelectronic and Information Systems (iNIS), 2016, pp. 34-37.

Tsai et al., "A Two-Step Readout CMOS Image Sensor Active Pixel Architecture", IEEE Sensors, 2011, pp. 1941-1945.

Vu et al., "Evaluation of 10MeV Proton Irradiation on 5.5 Mpixel Scientific CMOS Image Sensor", SPIE Remote Sensing Europe, vol. 7826, 2010, pp. 1-8.

Zhang et al., "Compact all-CMOS Spatiotemporal Compressive Sensing Video Camera with Pixel-Wise Coded Exposure", Optics Express, vol. 24, No. 8, 2016, pp. 9013-9024.

Merkel, Jordan, "FeFET Process Integration and Characterization," 37th Annual Microelectronic Engineering Conference, 2019, pp. 1-6.

Mcglone, Joseph F., "Ferroelectric HfO2 Thin Films for FeFET Memory Devices," 34th Annual Microelectronic Engineering Conference, 2016, pp. 1-6.

* cited by examiner

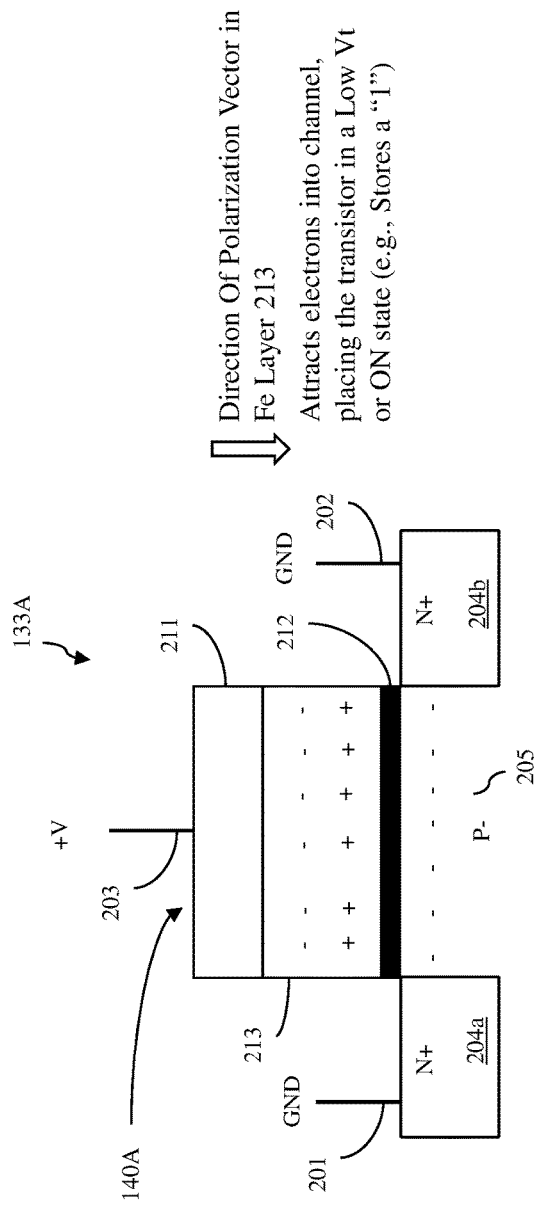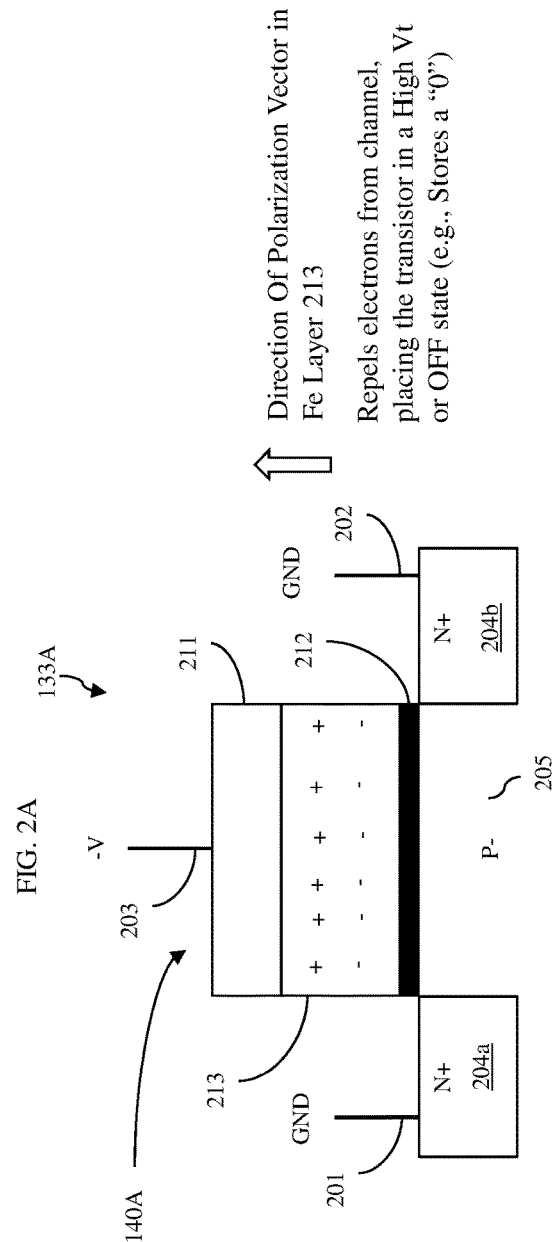
FIG. 2A
FIG. 2B

INTEGRATED PIXEL AND THREE-TERMINAL NON-VOLATILE MEMORY CELL AND AN ARRAY OF CELLS FOR DEEP IN-SENSOR, IN-MEMORY COMPUTING

BACKGROUND

Field of the Invention

The present invention relates to complex computing applications (e.g., cognitive computing applications) and, more particularly, to an integrated pixel and three-terminal non-volatile memory (NVM) cell and an array of the cells configured for deep in-sensor, in-memory computing.

Description of Related Art

More specifically, image and voice processing applications typically employ cognitive computing and, particularly, neural networks (NNs) for recognition and classification. Those skilled in the art will recognize that a NN is a deep learning algorithm where approximately 90% of the computations performed in the algorithm are multiply and accumulate (MAC) operations. For example, in a NN for image processing, the various MAC operations are used to compute the products of inputs (also referred to as activations), which are identified intensity values of the pixels in a receptive field, and weights in a filter matrix (also referred to as a kernel) of the same size as the receptive field, and to further compute the sum of the products. These computations are referred to as dot product computations. Historically, software solutions were employed to compute NNs. However, processors with hardware-implemented NN's have been developed to increase processing speed. One disadvantage of processors with hardware-implemented NNs is that they are discrete processing units. For example, a processor with a hardware-implemented NN is typically physically separated from the pixel array that captures the input data (i.e., the processor and the pixel array are in different consumer electronic devices or different chips within the same device). As a result, the data from the pixel array must be uploaded to the processor prior to performing any cognitive computing.

SUMMARY

In view of the foregoing, disclosed herein embodiments of an integrated pixel and three-terminal non-volatile memory (NVM) cell and embodiments of integrated circuit (IC) structure (i.e., a processing chip) that incorporates an array of such cells for performing deep in-sensor, in-memory computing (e.g., of neural networks). Also disclosed herein are method embodiments for operating an integrated pixel and three-terminal NVM cell and for operating an array of such cells (e.g., to perform deep in-sensor, in-memory computing).

Specifically, disclosed herein are embodiments of an integrate pixel and three-terminal NVM cell. The cell can include at least a select transistor and a pixel. The pixel can include a reset transistor, a photodiode connected in series with the reset transistor, and a sense node at a junction between the reset transistor and the photodiode. The pixel can also include an amplifying transistor, which is connected in series with the select transistor and which has a gate connected to the sense node. The amplifying transistor can specifically be a three-terminal NVM device configured so that the gate is a data storage node. For example, the amplifying transistor can be a floating gate field effect transistor (FGFET), a charge trap (CT) field effect transistor (CTFET) or a ferroelectric field effect transistor (FeFET). Such a cell can be selectively operated in a write mode, a read mode and a functional computing mode, as discussed further in the detailed description section.

Also disclosed herein are embodiments of integrated circuit (IC) structure (i.e., a processing chip) that incorporates an array of integrated pixel and three-terminal NVM cells. The cells can be arranged in columns and rows and the IC structure can further include bitlines connected to the columns of cells, respectively, and wordlines connected to the rows of cells, respectively. Each cell in a given column and row can be configured as described above. That is, the cell can include at least include a select transistor and a pixel. The select transistor can have a gate connected to a wordline for the row. The pixel can include: a photodiode; a reset transistor, which is connected in series between a first adjustable voltage rail and the photodiode; and a sense node at a junction between the reset transistor and the photodiode. The pixel can also include an amplifying transistor, which has a gate connected to the sense node. The amplifying transistor and the select transistor can be connected in series between a second adjustable voltage rail and a bitline for the column. The amplifying transistor can specifically be a three-terminal NVM device configured so that the gate effectively functions as a data storage node. For example, the amplifying transistor can be a floating gate field effect transistor (FGFET), a charge trap field effect transistor (CTFET) or a ferroelectric field effect transistor (FeFET). The cells in the array can all be selectively operated in a write mode, a read mode and a functional computing mode.

For example, during the write mode in a specific cell in a specific row and a specific column, the reset transistor and the select transistor of the specific cell can be turned on and specific bias conditions can be applied to the first adjustable voltage rail, to the second adjustable voltage rail and to a specific bitline for the specific column containing the specific cell in order to selectively bias all three terminals of the three-terminal NVM device. Specifically, the gate of the three-terminal NVM device can be biased by the first adjustable voltage rail through the reset transistor (which is in the ON state). One source/drain region of the three-terminal NVM device can be biased by the second adjustable voltage rail. The other source/drain region of the three-terminal NVM device can be biased by the specific bitline for the specific column through the select transistor (which is also in the ON state). Different bias conditions can be used to store a given one of multiple possible first data values (e.g., a logic "1" or a logic "0") in the data storage node of that three-terminal NVM device (i.e., in the gate). It should be noted that the specific bias conditions applied to the different terminals will vary depending upon the desired stored data value and also on the type and configuration of the three-terminal NVM device (as discussed further in the detailed description section).

During the read mode of in a specific cell in a specific row and a specific column, the specific bitline for the specific column can be connected to ground. Additionally, 0 volts can be applied to the first adjustable voltage rail and a read voltage (Vread), which is less than VDD, can be applied to the second adjustable voltage rail. Then, the reset and select transistors of the specific cell can be turned on any change in a given electrical parameter (e.g., a read current (Tread)) on the specific bitline for the specific column can be sensed in order to read out the first data value.

During the functional computing mode in a specific cell in a specific row and a specific column, the first adjustable voltage rail can be set to a high positive voltage level (e.g., to VDD). Then, the reset transistor can be turned on, while the select transistor remains off, in order to pre-charge the sense node in the specific cell (e.g., to VDD). Once the sense node is pre-charged, the reset transistor can be turned off. Additionally, a read voltage (Vread), which is less than VDD, can be applied to the second adjustable voltage rail and the specific bitline for the specific column can be connected to ground. Then, a light sensing process can be performed by the pixel. That is, the photodiode of the specific cell can be exposed to light, resulting in a second data value being on the sense node. The select transistor can then be turned on and a given electrical parameter (e.g., a bitline voltage or bitline current) on the specific bitline for the specific column can be sensed. Any change in the given electrical parameter in response to the functional computing process steps will be indicative of a product of the first data value and the second data value in the specific cell. Furthermore, a total change in the given electrical parameter on the specific bitline in response to multiple cells in the same specific column concurrently operating in the functional computing mode will be indicative of a result of a dot product computation. Thus, the above-described IC can be employed for deep in-sensor, in-memory computing of applications that require the performance of dot product computations (e.g., for deep in-sensor, in-memory computing of neural networks).

Also disclosed herein are associated method embodiments. Specifically, a disclosed method can include providing an integrated circuit (IC) structure (i.e., a processing chip), as described in detail above, that incorporates an array of integrated pixel and three-terminal NVM cells. The method can further include selectively operating the cells in that array in a write mode, a read mode and a functional computing mode.

Specifically, operating a specific cell in a specific row and a specific column in a write mode can include applying specific bias conditions to the first adjustable voltage rail, to the second adjustable voltage rail, and to a specific bitline for the specific column and then turning on the reset transistor and the select transistor of the specific cell in order to selectively bias all three terminals of the three-terminal NVM device. Specifically, the gate of the three-terminal NVM device can be biased by the first adjustable voltage rail through the reset transistor (which is in the ON state). One source/drain region of the three-terminal NVM device can be biased by the second adjustable voltage rail. The other source/drain region of the three-terminal NVM device can be biased by the specific bitline for the specific column through the select transistor (which is also in the ON state). Depending upon the specific bias conditions, one of multiple possible first data values (e.g., a logic "1" or a logic "0") can be stored in the data storage node of that three-terminal NVM device (i.e., in the gate). It should be noted that the specific bias conditions will vary depending upon the desired stored data value and also on the type and configuration of the three-terminal NVM device (as discussed further in the detailed description section).

Operating a specific cell in a specific row and a specific column in a read mode can include connecting a specific bitline for the specific column to ground, applying 0 volts to the first adjustable voltage rail, and applying a read voltage (e.g., Vread), which is less than VDD) to the second adjustable voltage rail. Then, the reset and select transistors of the specific cell can be turned on and any change in a given electrical parameter (e.g., a read current (Tread)) on the specific bitline for the specific column can be sensed in order to read out the first data value.

Operating a specific cell in a specific row and a specific column in a functional computing mode can include setting the voltage level on the first adjustable voltage rail to a high positive voltage level (e.g., VDD). The sense node of the specific cell can be pre-charged by turning on the reset transistor, while keeping the select transistor turned off. Once the sense node is pre-charged, the reset transistor can be turned off. Additionally, a read voltage (Vread), which is less than VDD, can be applied to the second adjustable voltage rail and the specific bitline for the specific column can be connected to ground. Then, a light sensing process can be performed by the pixel. The light sensing process can include exposing the photodiode of the specific cell to light resulting in a second data value being output on the sense node, turning on the select transistor for the specific cell and then sensing any change in a given electrical parameter (e.g., a bitline voltage or bitline current) on the specific bitline for the specific column. Change in the given electrical parameter on the specific bitline in response the functional computing process steps will be indicative of a product of the first data value and the second data value in the specific cell. Furthermore, a total change in the given electrical parameter on the specific bitline in response to multiple cells in the same specific column concurrently operating in the functional computing mode will be indicative of a result of a dot product computation. Thus, the method can be employed for deep in-sensor, in-memory computing of applications that require dot product computations (e.g., for deep in-sensor, in-memory computing of neural networks).

BRIEF DESCRIPTION OF THE SEVERAL VIEWS OF THE DRAWINGS

The present invention will be better understood from the following detailed description with reference to the drawings, which are not necessarily drawn to scale and in which:

FIGS. 2A and 2B are diagrams illustrating different states of ferroelectric field effect transistor (FeFET)-type three-terminal NVM device;

DETAILED DESCRIPTION

Figure 1:
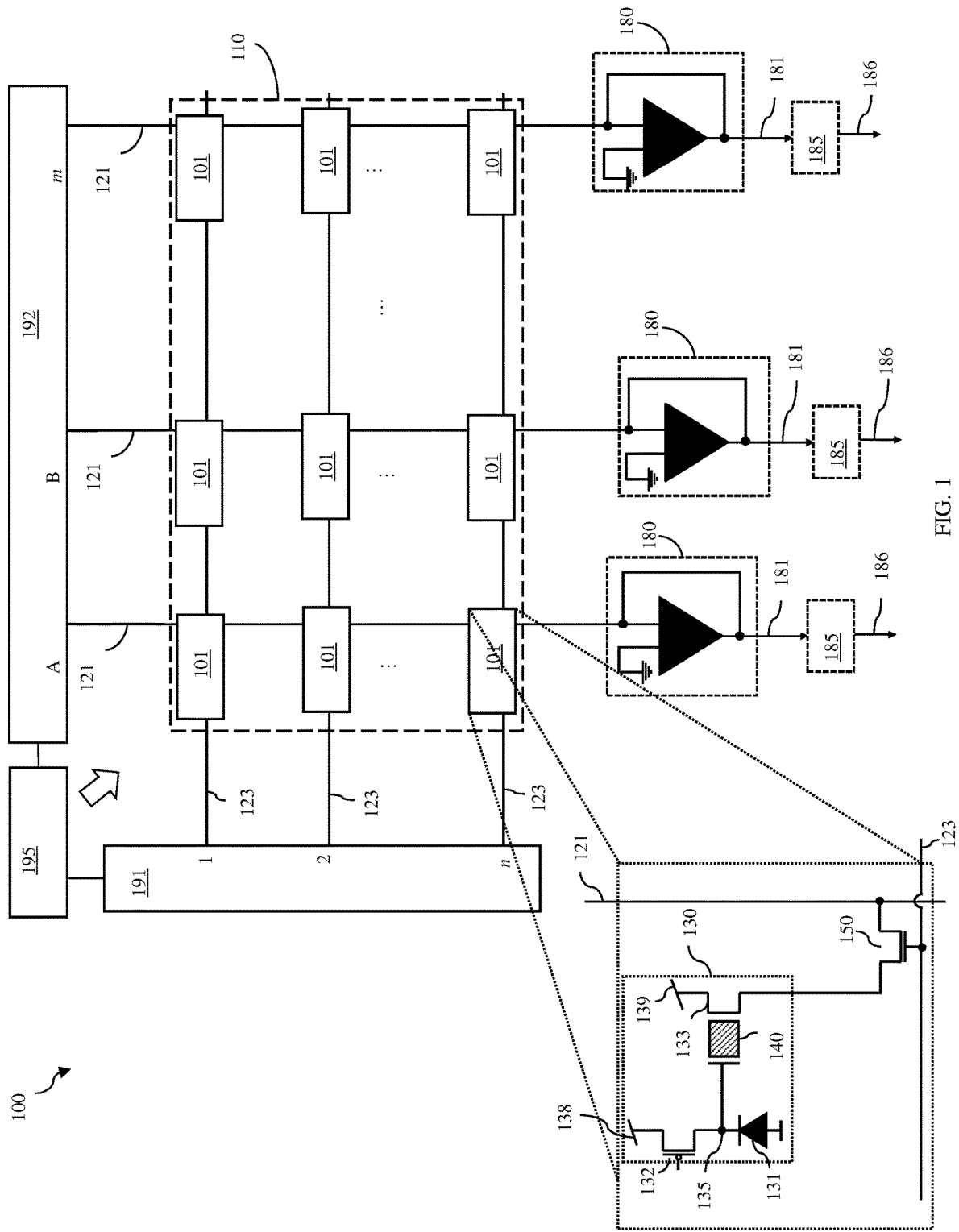
FIG. 1 is a schematic diagram illustrating an embodiment of an integrated pixel and three-terminal NVM cell and an embodiment of an integrated circuit (IC) structure that includes an array of the cells.

As mentioned above, image and voice processing applications typically employ cognitive computing and, particularly, neural networks (NNs) for recognition and classification. Those skilled in the art will recognize that a NN is a deep learning algorithm where approximately 90% of the computations performed in the algorithm are multiply and accumulate (MAC) operations. For example, in a NN for image processing, the various MAC operations are used to compute the products of inputs (also referred to as activations), which are identified intensity values of the pixels in a receptive field, and weights in a convolution filter matrix (also referred to as a kernel) of the same size as the receptive field, and to further compute the sum of the products. Historically, software solutions were employed to compute NNs. However, processors with hardware-implemented NN's have been developed to increase processing speed. One disadvantage of processors with hardware-implemented NNs is that they are discrete processing units. For example, a processor with a hardware-implemented NN is typically physically separated from the pixel array that captures the input data (i.e., the processor and the pixel array are in different consumer electronic devices or different chips within the same device). As a result, the data from the pixel array must be uploaded to the processor prior to performing any cognitive computing.

In view of the foregoing, disclosed herein are embodiments of an integrated pixel and three-terminal non-volatile memory (NVM) cell and of an integrated circuit (IC) structure that incorporates an array of such cells. The disclosed cell can specifically incorporate a pixel, where the amplifying transistor is a three-terminal NVM device (e.g., a floating gate field effect transistor (FGFET), a charge trap field effect transistor (CTFET) or a ferroelectric field effect transistor (FeFET)). Given the configuration of the cell (as described in greater detail below), it can be selectively operated in write, read and functional computing modes. In the write mode, a first data value (e.g., a binary weight value) can be stored in the data storage node of the NVM device (i.e., in the gate of the amplifying transistor). In the read mode, the first data value can be read from the data storage node. In the functional computing mode, the pixel can capture a second data value (e.g., an analog input value) and an electrical parameter (e.g., bitline voltage or bitline current) on a bitline, which is connected to the cell, can be sensed. Any change in the electrical parameter on the bitline will be function of both the first data value and the second data value. The disclosed IC structure can include an array of such cells arranged in columns and rows. If multiple cells in a given column are concurrently operated in the functional computing mode, the total change in the electrical parameter on the bitline for the column will be indicative of a result of a dot product computation. Thus, the IC structure can be employed for deep in-sensor, in-memory computing of applications that require dot product computations (e.g., for deep in-sensor, in-memory computing of neural networks).

FIG. 1 is a schematic diagram illustrating embodiments of an integrated pixel and three-terminal non-volatile memory (NVM) cell 101 and embodiments of an integrated circuit (IC) structure 100 (i.e., a processing chip), which incorporates an array 110 of the cells 101.

Specifically, the IC structure 100 can include an array 110 of integrated pixel and three-terminal NVM cells 101. The cells 101 can be arranged in columns (e.g., see columns A, B, . . . m) and rows (e.g., see rows 1, 2, . . . n).

Wordlines 123 can be electrically connected to the cells 101 in each row. Bitlines 121 can be electrically connected to the cells 101 in each column.

Each cell 101 in a specific row and a specific column can include: a select transistor 150 and a pixel 130.

In each cell 101, the select transistor 150 can be an N-type field effect transistor (NFET). The select transistor 150 can have a gate electrically connected to the wordline 123 of the specific row containing that cell. The select transistor 150 can further have a source region electrically connected to the bitline 121 for the specific column containing that cell.

In each cell 101, the pixel 130 can include a photodiode 131 and a reset transistor 132. The photodiode 131 can be, for example, a PIN photodiode. The reset transistor 132 can be, for example, a p-type field effect transistor (PFET) with a gate controlled by a reset signal (RST) (e.g., from a controller 195). The reset transistor 132 can be electrically connected in series between a first adjustable voltage rail 138 and the photodiode 131. For purposes of this disclosure, an adjustable voltage rail refers to a voltage rail wherein the voltage level on the voltage rail can be selectively adjusted. The pixel 130 can further include a sense node 135 at the junction between the photodiode 131 and the reset transistor 132.

In each cell 101, the pixel 130 can further include an amplifying transistor 133, which is electrically connected in series between a second adjustable voltage rail 139 and the select transistor 150. This amplifying transistor 133 can be an n-type field effect transistor (NFET) and a gate of the amplifying transistor 133 can be electrically connected to the sense node 135. Additionally, this amplifying transistor 133 can specifically be configured as a three-terminal non-volatile memory (NVM) device where the gate is selectively programmable for the purposes of adjusting the threshold voltage (Vt) of the amplifying transistor (e.g., for switching the Vt to any one of multiple stable Vt states). Thus, the gate can effectively function as a data storage node 140. For example, in some embodiments, the three-terminal NVM device could be configured with a gate that is selectively programmable so that the amplifying transistor could have either (a) a low threshold voltage (e.g., so that the amplifying transistor is in an ON state) in order to store one logic value (e.g., a logic "1") on the data storage node 140; or (b) a high threshold voltage (e.g., so that the amplifying transistor is in an OFF state) in order to store a different logic value (e.g., a logic "0") on the data storage node 140. In other embodiments, the NVM device could be configured with a gate that is selectively programmable so that the amplifying transistor could have any one of two or more different threshold voltages and, thereby so that the data store node can store any one two or more different data values (e.g., 2-bit binary numbers such as 00, 01, 10, and 11).

Figure 3A:
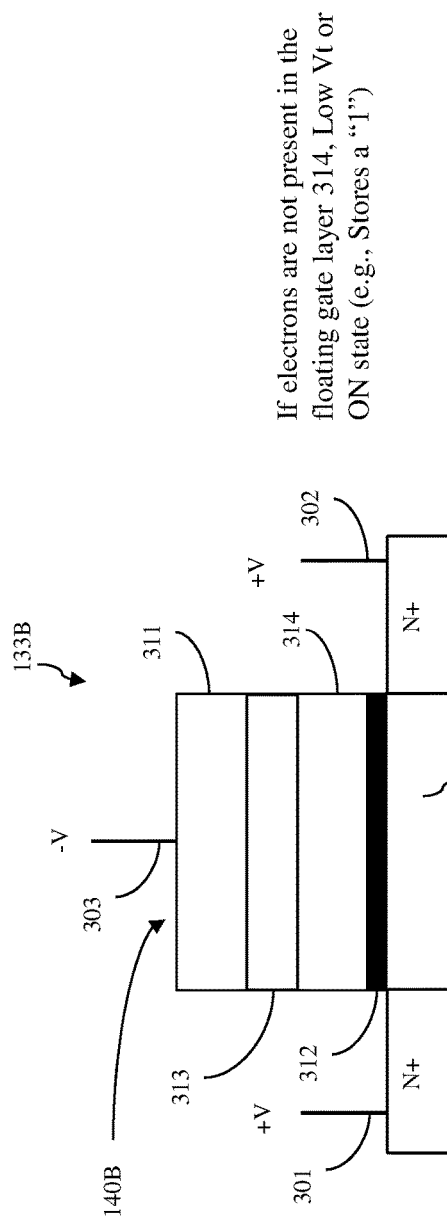
FIGS. 3A and 3B are diagrams illustrating different states of floating gate field effect transistor (FGFET)-type three-terminal NVM device.
Figure 3B:
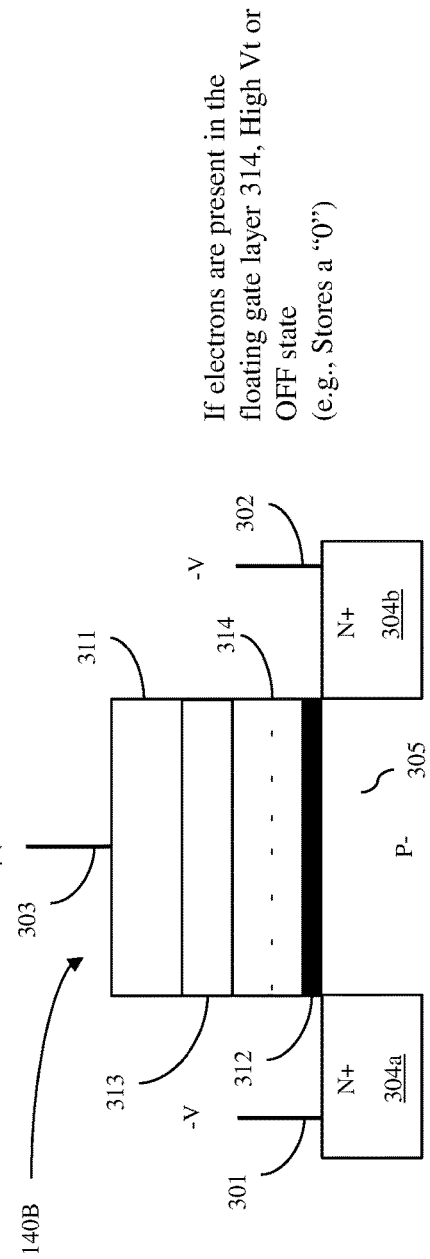
Figure 4A:
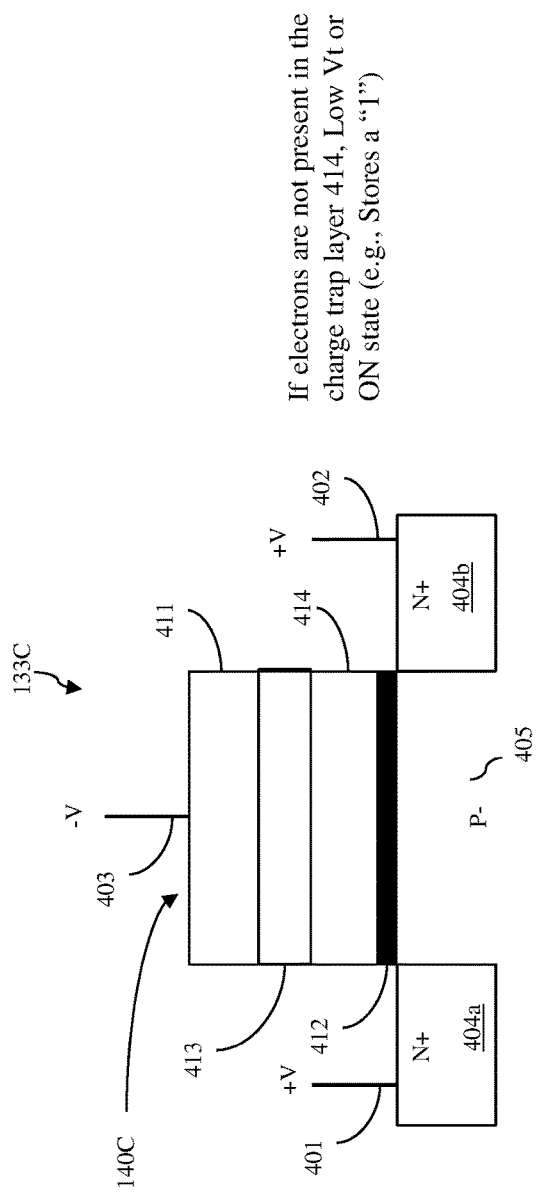
FIGS. 4A and 4B are diagrams illustrating different states of a charge trap field effect transistor (CTFET)-type three-terminal NVM device.
Figure 4B:
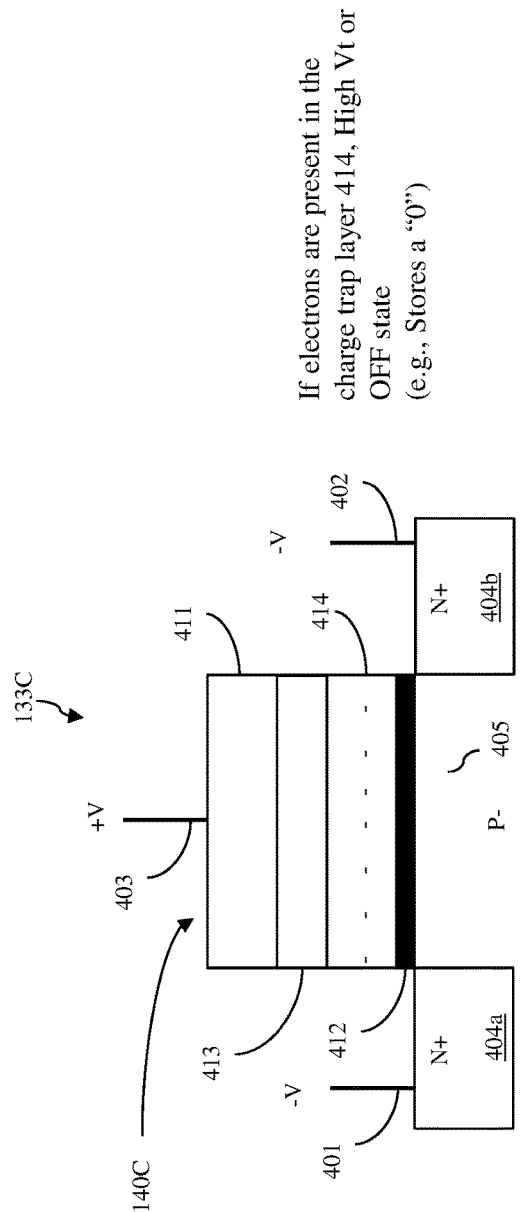

Exemplary three-terminal NVM devices that could be employed for use as the amplifying transistor 133 in the pixel 130 of the cells 101 include, but are not limited to, a ferroelectric field effect transistor (FeFET) 133A (as shown in FIGS. 2A-2B), a floating gate field effect transistor (FGFET) 133B (as shown in FIGS. 3A-3B, or a charge trap field effect transistor (CTFET) 133C (as shown in FIGS. 4A-4B).

Referring to FIGS. 2A-2B, those skilled in the art will recognize that an N-type FeFET 133A can include N+ source/drain regions 204a-204b (i.e., first and second terminals 201-202) and a channel region 205 (e.g., a P− channel region) positioned between the N+ source/drain regions 204a-204b. The FeFET 133A can further include a gate 140A (i.e., a third terminal 203) (also referred to herein as a data storage node for the three-terminal NVM device) adjacent to the channel region 205. This gate 140A can be a multi-layered structure including, for example, a gate dielectric layer 212 on the channel region 205, a ferroelectric layer 213 (e.g., a hafnium oxide layer or some other suitable ferroelectric layer) on the gate dielectric layer 212, and a control gate layer 211 (e.g., a metal gate layer) on the ferroelectric layer 213. The gate 140A can be selectively programmed so that the FeFET 133A has either a low Vt (e.g., so that the amplifying transistor is stable in an ON state) to store one data value (e.g., a logic "1") or a high Vt (e.g., so that the amplifying transistor is stable in an OFF state) to store another data value (e.g., a logic "0"). For example, to program the gate 140A so that the FeFET 133A has a low V, a positive voltage pulse (e.g., VDD) could be applied to the gate 140A and 0 volts could be applied to the N+ source/drain regions 204a-204b (e.g., the N+ source/drain regions 204a-204b could be discharged to ground). This results in the direction of polarization vector of the ferroelectric layer 213 pointing toward the channel region 205 (i.e., it results in + poles of di-poles in the layer 213 being adjacent to the channel region 205 and − poles of the dipoles being adjacent to the control gate layer 211) such that electrons are attracted to the channel region 205, thereby creating a conductive region in the channel region 205 between the N+ source/drain regions 204a-204b (see FIG. 2A). Thus, one logic value (e.g., a logic "1") is considered stored on the data storage node 140A. To program the gate 140A so that the FeFET 133A has a high threshold voltage, a negative voltage pulse can be applied to the gate 140A and 0 volts can be applied to the N+ source/drain regions 204a-204b (e.g., again discharging the N+ source/drain regions 204a-204b to ground). This results in the direction of polarization vector of the ferroelectric layer 213 pointing toward the control gate layer 211 (i.e., it results in + poles of di-poles in the layer 213 being adjacent to the control gate layer 211 and − poles of the dipoles being adjacent to the channel region 205) such that electrons are repelled from channel region 205, thereby eliminating any conductive region between the N+ source/drain regions 204a-204b (see FIG. 2B). Thus, a different logic value (e.g., a logic "0") is considered stored on the data storage node 140A. Alternatively, the gate 140A could be selectively programmed so that the FeFET 133A has any one of more than two different threshold voltages to store any one of multiple different multi-bit binary numbers (e.g., 00, 01, 10, and 11).

Referring to FIGS. 3A-3B, those skilled in the art will recognize that an N-type FGFET 133B can include N+ source/drain regions 304a-304b (i.e., first and second terminals 301-302) and a channel region 305 (e.g., a P− channel region) positioned between the N+ source/drain regions 304a-304b. The FGFET 133B can further include a gate 140B (i.e., a third terminal 303) (also referred to herein as a data storage node) adjacent to the channel region 305. The gate 140B can be a multi-layered structure including, for example, a gate dielectric layer 312 on the channel region 305, a floating gate layer 314 (e.g., a polysilicon layer) on the gate dielectric layer 312, another gate dielectric layer 313 on the floating gate layer 314 and a control gate layer 311 (e.g., a metal gate layer) on the gate dielectric layer 313. The gate 140B can be selectively programmed so that the FGFET 133B has either a low Vt (e.g., so that the amplifying transistor is stable in an ON state) to store one data value (e.g., a logic "1") or a high Vt (e.g., so that the amplifying transistor is stable in an OFF state) to store another data value (e.g., a logic "0"). For example, to selectively program the gate 140B so that the amplifying transistor 133B has a high threshold voltage, a positive voltage pulse (e.g., VDD) can be applied to the gate 140B and a negative voltage pulse can be applied to the N+ source/drain regions 304a-304b. This results in electrons moving into the floating gate layer 314 increasing the threshold voltage of the device (see FIG. 3B). Thus, one logic value (e.g., a logic "0") is considered stored on the data storage node 140B. To selectively program the gate 140B so that the FGFET 133B has a low threshold voltage, a negative voltage pulse can be applied to the gate 140B and a positive voltage pulse (e.g., VDD) can be applied to the N+ source/drain regions 304a-304b. This results in electrons moving out of the floating gate layer 314 decreasing the threshold voltage of the device (see FIG. 3A). Thus, a different logic value (e.g., a logic "1") is considered stored on the data storage node 140B. Alternatively, the gate 140B could be selectively programmed so that the FGFET 133B has any one of more than two different threshold voltages to store any one of multiple different multi-bit binary numbers (e.g., 00, 01, 10, and 11).

Referring to FIGS. 4A-4B, those skilled in the art will recognize that an N-type CTFET 133C can include N+ source/drain regions 404a-404b (i.e., first and second terminals 401-402) and a channel region 405 (e.g., a P− channel region) positioned between the N+ source/drain regions 404a-404b. The CTFET 133C can further include a gate 140C (i.e., a third terminal 403) (also referred to herein as a data storage node) adjacent to the channel region 405. The gate 140C can be a multi-layered structure including, for example, a gate dielectric layer 412 on the channel region 405, a charge trap layer 414 (e.g., a silicon nitride layer) on the gate dielectric layer 412, another gate dielectric layer 413 on the charge trap layer 414 and a control gate layer 411 (e.g., a metal gate layer) on the gate dielectric layer 413. The gate 140C can be selectively programmed so that the CTFET 133C has either a low Vt (e.g., so that the amplifying transistor is stable in an ON state) to store one data value (e.g., a logic "1") or a high Vt (e.g., so that the amplifying transistor is stable in an OFF state) to store another data value (e.g., a logic "0"). For example, in order to selectively program the gate 140C so that the CTFET 133C has a high threshold voltage, a positive voltage pulse (e.g., VDD) can be applied to the gate 140C and a negative voltage pulse can be applied to the N+ source/drain regions 404a-404b. This results in electrons moving into the charge trap layer 414, thereby increasing the threshold voltage of the device (see FIG. 4B) Thus, one logic value (e.g., a logic "0") is considered stored on the data storage node 140C. In order to selectively program the gate 140C so that the CTFET 133C has a low threshold voltage, a negative voltage pulse can be applied to the gate 140C and a positive voltage pulse (e.g., VDD) can be applied to the N+ source/drain regions 404a-404b. This results in electrons moving out of the charge trap layer 414, thereby decreasing the threshold voltage of the device (see FIG. 4A). Thus, a different logic value (e.g., a logic "1") is considered stored on the data storage node 140C. Alternatively, the gate 140C could be selectively programmed so that the CTFET 133C has any one of more than two different threshold voltages to store any one of multiple different multi-bit binary numbers (e.g., 00, 01, 10, and 11).

The IC structure 100 can further be configured so that any of the cells 101 in the array 110 are individually or concurrently selectively operable in a write mode, in a read mode and a functional computing mode. Specifically, the IC structure 100 can further include a sense circuit configured to sense changes in the voltage levels on (or current flowing through) the bitlines 121 of the columns in the IC structure 100. For example, the sense circuit can include transimpedance amplifiers (TIAs) 180 for each of the columns, respectively. The TIAs 180 can detect and output (i.e., can be adapted to detect and output, can be configured to detect and output, etc.) the analog voltage levels on the bitlines 121 for each column, respectively. Specifically, each TIA 180 can have a first input, which is electrically connected to ground, and a second input, which is electrically connected to a bitline 121 for a column in order to receive a current (Iin) from that bitline 121. Each TIA 180 can further convert (i.e., can be adapted to convert, can be configured an output, etc.) the received current (Iin) into an analog output voltage (Vout). The analog output voltage 181 of the TIA 180 (i.e., Vout) can further be electrically connected via a feedback resistor to the bitline 121 for the column (i.e., to the second input). In any case, various different TIA configurations are well known in the art. Thus, the details of the TIAs have been omitted from this specification in order to allow the reader to focus on the salient aspects of the disclosed embodiments.

Optionally, the IC structure 100 can further include analog-to-digital converters (ADCs) 185 for each of the columns, respectively. The ADCs 185 can receive the analog output voltages 181 from the TIA's 180, respectively, and can convert (i.e., can be adapted to convert, can be configured to convert, etc.) those analog output voltages 181 into digital outputs 186, respectively. ADCs capable of converting analog output voltages to digital values are well known in the art. Thus, the details of the ADCs have been omitted from this specification in order to allow the reader to focus on the salient aspects of the disclosed embodiments.

The IC structure 100 can further include a controller 195 and peripheral circuitry 191-192. In response to control signals from the controller 195, the peripheral circuitry 191-192 can enable the cells 101 to be individually or concurrently selectively operated in a write mode, a read mode or a functional computing mode, as discussed below. Peripheral circuitry 191 connected to the rows (at one end or at a combination of both ends) can include, for example, address decode logic and wordline drivers for activating selected wordlines (i.e., for switching selected wordlines from low to high voltage levels) during the write, read and functional computing operations. Peripheral circuitry 192 connected to the columns (at one end or at a combination of both ends) can include column address decode logic and bitline drivers for appropriately biasing selected bitlines during the write, read and functional computing operations. Additional peripheral circuitry (not shown) can also supply the reset signals to gates of the reset transistors of the pixels in the cells and can switch the voltage levels on first and second adjustable voltage rails 138-139 (as discussed in greater detail below). Controllers and peripheral circuitry used to enable pixel array and memory array operations are well known in the art. Thus, the details thereof have been omitted from this specification in order to allow the reader to focus on the salient aspects of the disclosed embodiments.

As mentioned above, each cell 101 in the array 110 of the IC structure 100 of FIG. 1 is selectively operable in the following modes: (a) a write mode, wherein a first data value is written to the data storage node 140 of the three-terminal NVM device (i.e., to the gate of the amplifying transistor 133); (b) a read mode, wherein the first data value is read the cell 101; and (c) a functional computing mode.

For a write operation in a specific cell in a specific column and a specific row, a first data value can be written to the data storage node 140. To perform the write operation, the RST signal applied to the gate of the reset transistor 132 (which is a PFET) can be switched to a low voltage level (e.g., 0 volts), thereby turning on the reset transistor 132 and allowing the gate of the amplifying transistor 133 to be pulled up to VDD by the first adjustable voltage rail 138. Additionally, the specific wordline 123 for the specific row containing the specific cell 101 can be switched to the high voltage level (e.g., to VDD), thereby turning on the select transistor 150 for the specific cell 101. Thus, the three terminals of the three-terminal NVM device (i.e., the gate and two source/drain regions of the amplifying transistor 133) can be selectively biased. That is, different bias conditions can be applied to these terminals via the first adjustable voltage rail 138, the second adjustable voltage rail 139 and the specific bitline 121 in order to write a desired first data value (e.g., a logic "1" or a logic "0") into the data storage node 140.

As discussed above with regard to the different types of three-terminal NVM devices that could be incorporated into the pixel 130 as the amplifying transistor 133, the specific bias conditions used to write data values to the data storage node 140 depend upon the desired stored data value and on the type and configuration of the three-terminal NVM device. Furthermore, the first data value written to a cell could be one of two different single-bit binary data values (e.g., "1" or "0"). Alternatively, the first data value could be one of multiple multi-bit data values (e.g., 00, 01, 10, 11).

Figure 5A:
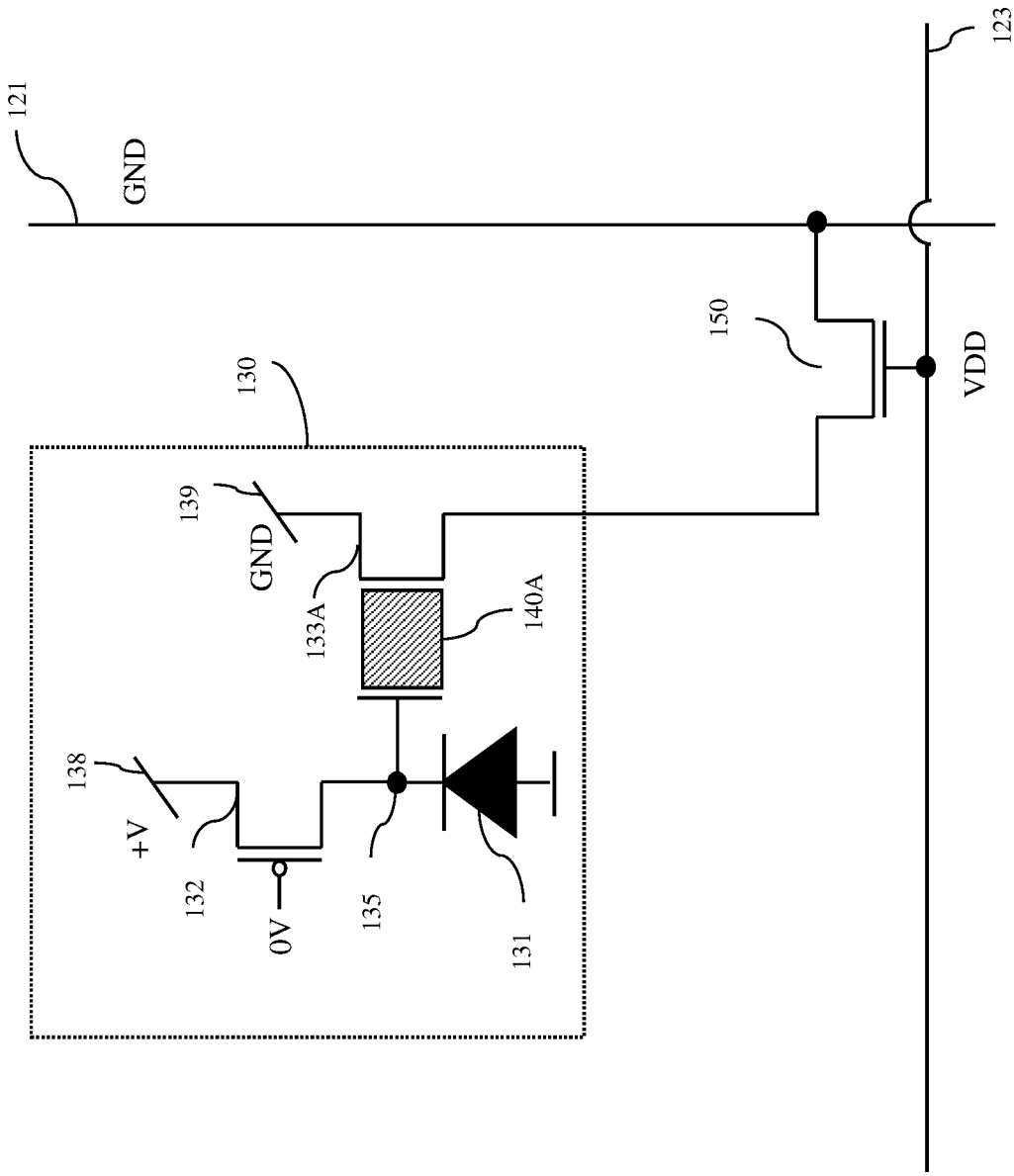
FIGS. 5A and 5B are schematic diagrams illustrating exemplary write "1" and write "0" operations, respectively, in an integrated pixel and three-terminal NVM cell that includes FeFET-type NVM device.
Figure 5B:
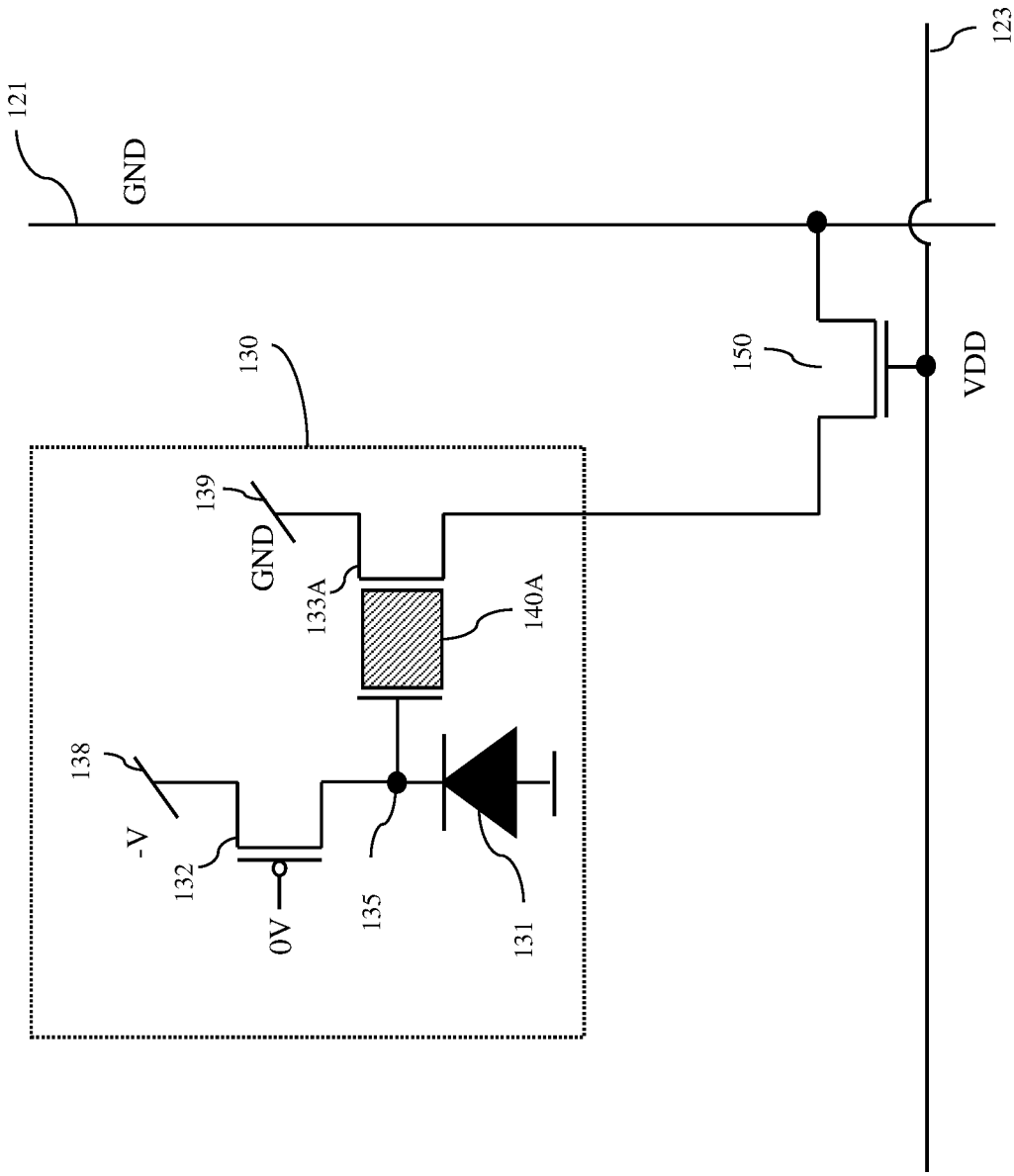

For purposes of illustration, the write operation is described below with respect to storage of one of two different single bit binary data values in the data storage node of an amplifying transistor configured as a FeFET (e.g., as shown in FIGS. 2A and 2B). Specifically, consider an exemplary integrated pixel and three-terminal NVM cell 101 where the amplifying transistor 133 of the pixel 130 is a FeFET 133A. For a write operation to write a first data value into this cell, both the reset transistor 132 and the select transistor 150 are turned on by switching the RST signal (which is applied to the gate of the reset transistor 132) to the low voltage level (e.g., 0 volts) and by switching the wordline 123 (which is connected to the gate of the select transistor 150) to the high voltage level (e.g., to VDD). Writing one logic value (e.g., a logic "1") can be performed by setting the voltage level on the first adjustable voltage rail 138 to a positive voltage level (e.g., to VDD) and by setting the voltage levels on the second adjustable voltage rail 139 and on the specific bitline 121 to 0 volts (i.e., by discharging the second adjustable voltage rail 139 and the specific bitline 121 to ground). Since the reset transistor 132 and the select transistor 150 are both turned on, the positive voltage is applied by the first adjustable voltage rail 138 through the reset transistor 132 to the gate 140A of the FeFET 133A, 0 volts are applied by the second adjustable voltage rail 139 directly to one N+ source/drain region, and 0 volts are applied by the specific bitline 121 through the select transistor 150 to the other N+ source/drain region. As a result, a conductive region is created by electron build up in the channel region between the N+ source/drain regions and, thus, one logic value (e.g., a logic "1") is considered stored on the data storage node 140A (see FIGS. 2A and 5A). Writing a different logic value (e.g., a logic "0") could be performed by setting the voltage level on the first adjustable voltage rail 138 to a negative voltage level and by again setting the voltage levels on the second adjustable voltage rail 139 and the specific bitline 121 to 0 volts. Since the reset transistor 132 and the select transistor 150 are turned on, the negative voltage is applied by the first adjustable voltage rail 138 through the reset transistor 132 to the gate 140A, 0 volts are applied by the second adjustable voltage rail 139 directly to one N+ source/drain region, and 0 volts are applied by the specific bitline 121 through the select transistor 150 to the other N+ source/drain region. As result, electrons are repelled from the channel region and any conductive region between the N+ source/drain regions is eliminated and, thus, a different logic value (e.g., a logic "0") is considered stored on the data storage node 140A (see FIGS. 2B and 5B).

It should be understood that if the amplifying transistor is a different type of three-terminal NVM device, write operations can similarly be performed by turning on the reset transistor 132 and the select transistor 150 and by applying specific bias conditions to the gate of the amplifying transistor 133 via the first adjustable voltage rail 138, to one source/drain region of the amplifying transistor via the second adjustable voltage rail 139 and to the other source/drain region of the amplifying transistor via the bitline 121 for the specific column. See the detailed discussions above regarding the specific biasing conditions needed to program the gate 140B of the FGFET 133B in FIGS. 3A-3B or the gate 140C of the CTFET 133C in FIGS. 4A-4B.

Figure 6:
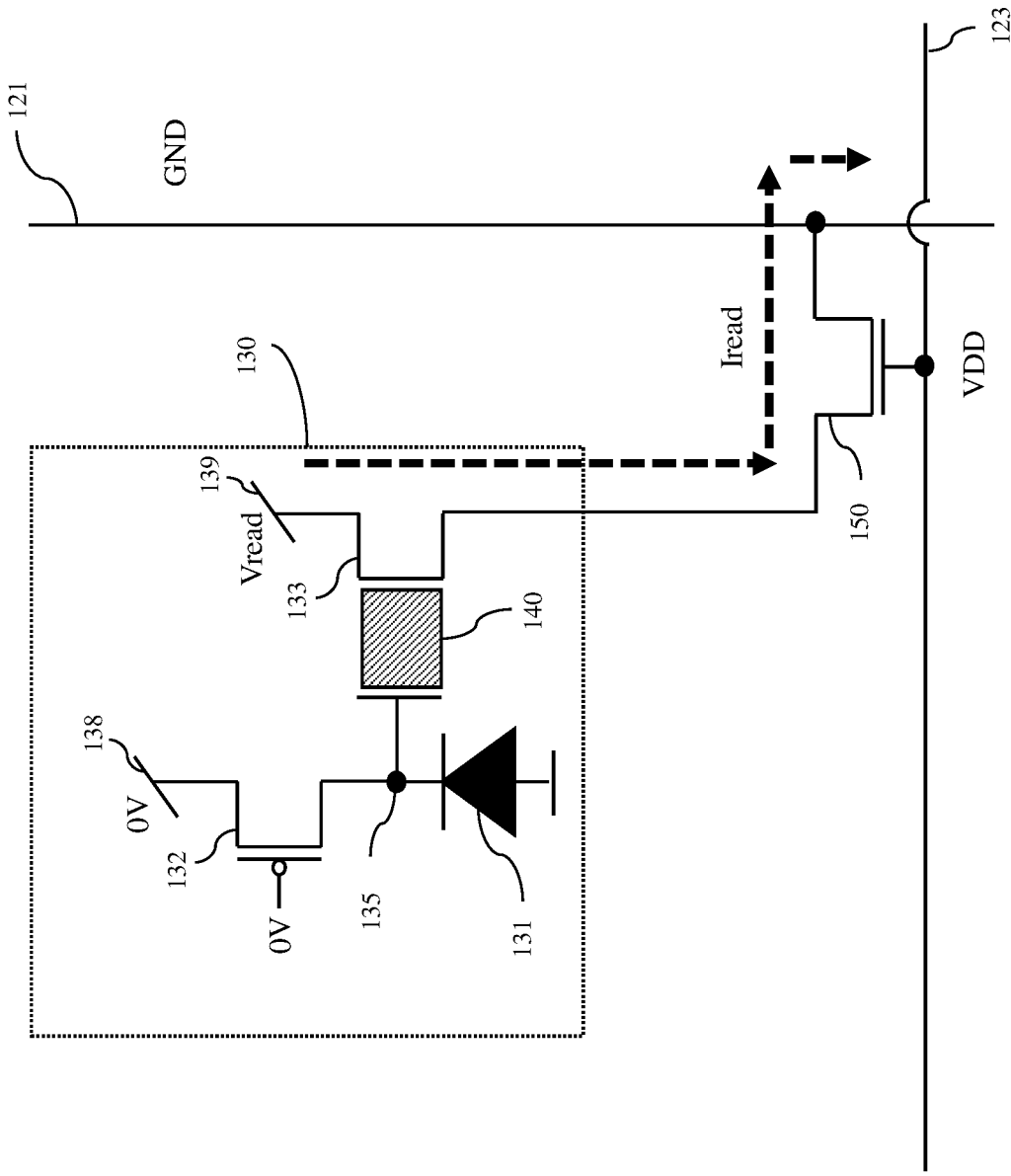
FIG. 6 is a schematic diagram illustrating an exemplary read operation an integrated pixel and three-terminal NVM cell.

In any case, for a read operation in a specific cell in a specific column and a specific row (see FIG. 6), a previously stored first data value can be read from the data storage node 140. To perform the read operation, the specific bitline 121 for the specific column can be connected to ground (e.g., through a low resistance path), the voltage level on the first adjustable voltage rail 138 can be set at 0 volts and the voltage level on the second adjustable voltage rail 139 can be set at a read voltage (Vread) level. Vread can be lower than VDD (e.g., by 30-70%) and the optimal level for Vread can be predetermined depending upon the type of NVM in the cell. The RST signal applied to the gate of the reset transistor 132 (which is a PFET) can be switched to the low voltage level (e.g., 0 volts), thereby turning on the reset transistor 132. Additionally, the specific wordline 123 connected to the gate of the select transistor 150 (which is an NFET) can be switched to the high voltage level (e.g., to VDD), thereby turning on the select transistor 150. As a result, 0 volts are applied to the gate of the amplifying transistor 133 (which is an NFET) through the reset transistor 132 so that flow of a read current (Tread) through the amplifying transistor 133 between the second adjustable voltage rail 139 and the bitline 121 is only enabled if the amplifying transistor 133 is already in the ON-state (e.g., storing a logic "1", as discussed above) and so that flow of Tread is blocked if the amplifying transistor 133 is in the OFF-state (e.g., storing a logic "0"). Thus, if only the specific wordline 123 for the row containing the cell is activated during the read operation (i.e., if no other wordlines connected to the cells in the specific column are activated), then Iread on the specific bitline 121 for the column and applied as the input (Iin) to the TIA 180 will indicate whether the first data value is a logic "1" or a logic "0".

Figure 7:
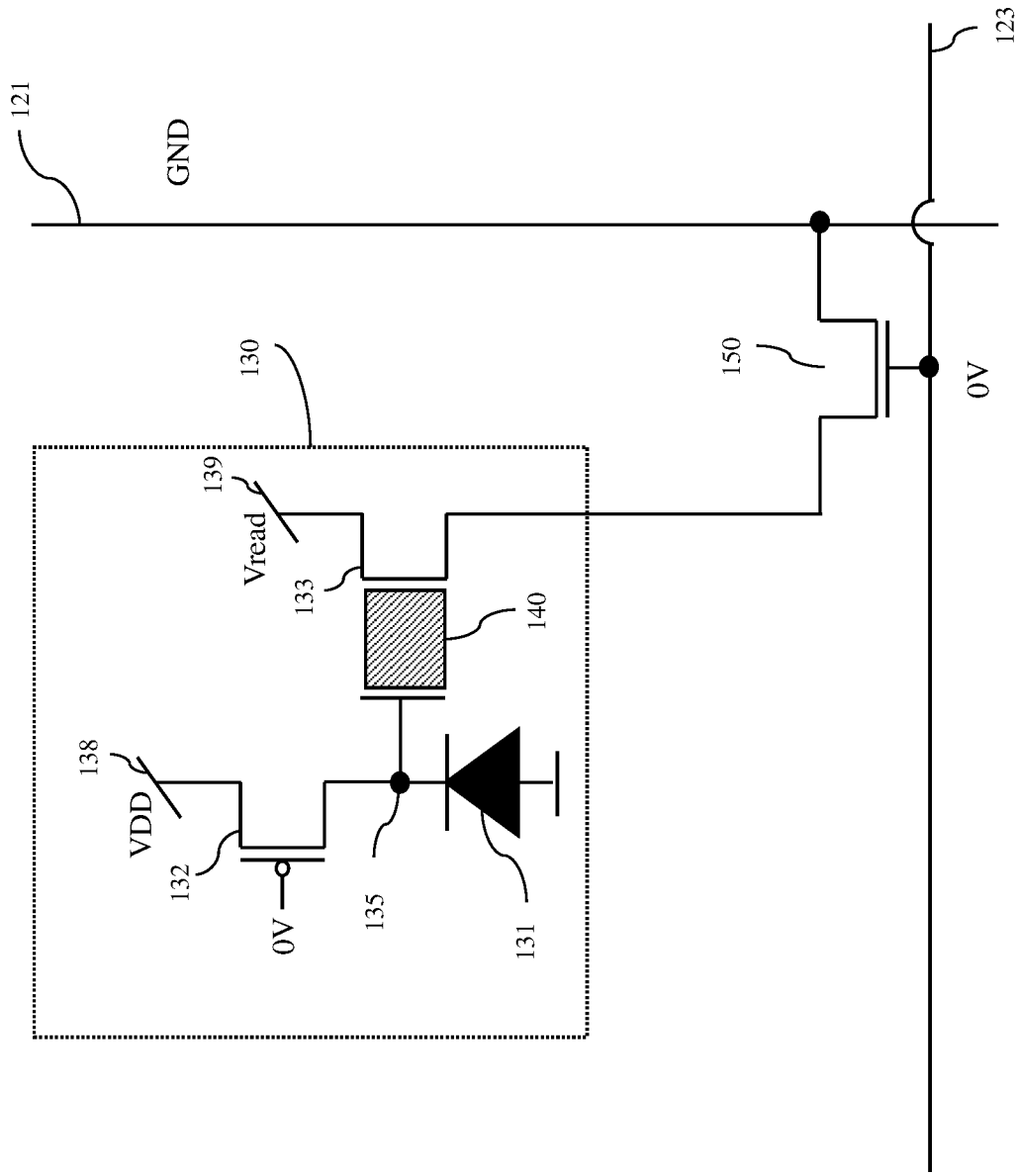
FIG. 7 is a schematic diagram illustrating an exemplary sense node pre-charge operation for a functional computing operation in an integrated pixel and three-terminal NVM cell.
Figure 8:
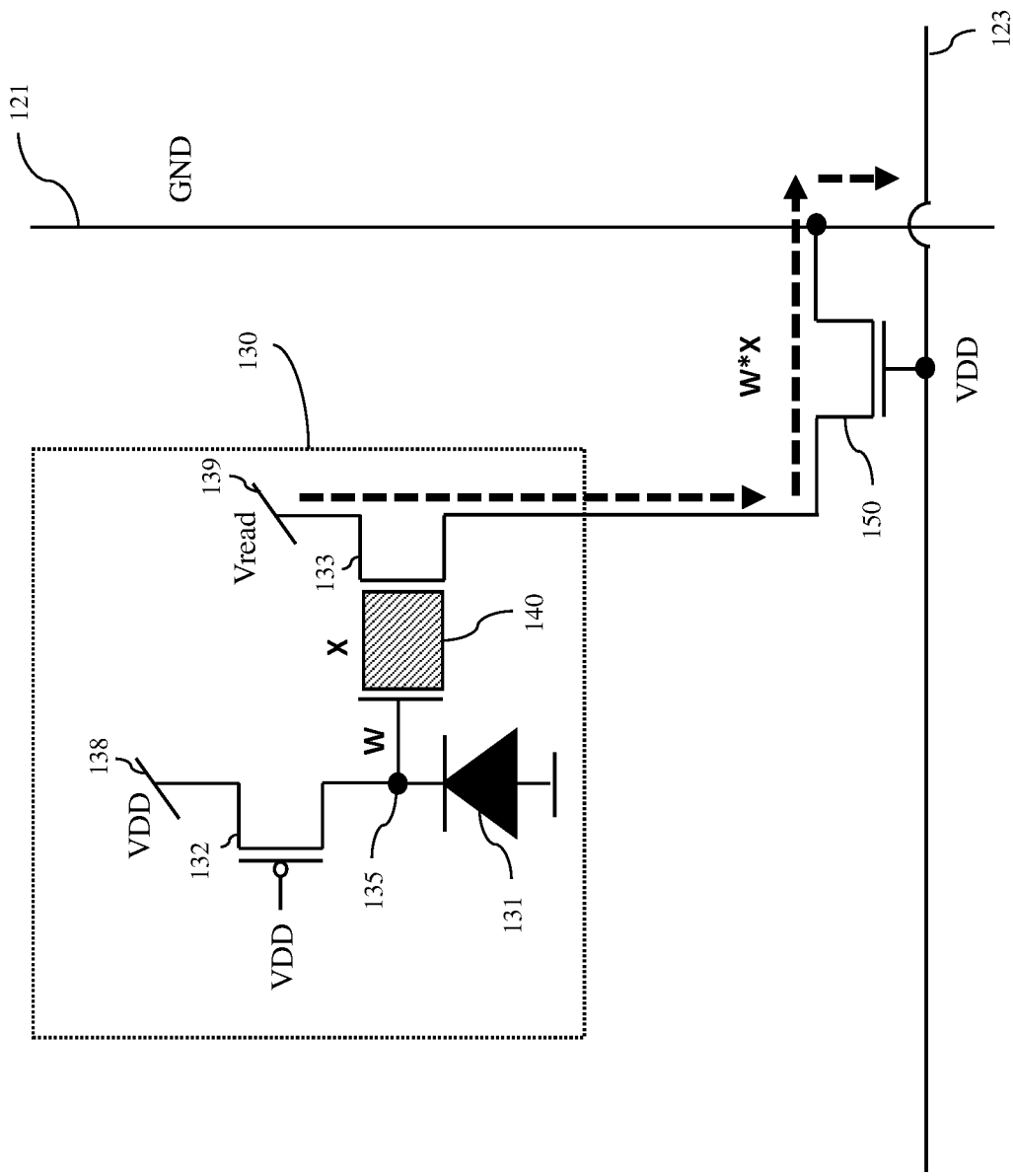
FIG. 8 is a schematic diagram illustrating an exemplary functional computing operation in an integrated pixel and three-terminal NVM cell.

For a functional computing operation, the sense node 135 can be pre-charged to the high voltage level (e.g., VDD) (see FIG. 7). To accomplish this, the voltage level on the first adjustable voltage rail 138 can be set at a high positive voltage level (e.g., VDD) and the reset signal (RST) applied to the gate of the reset transistor 132 can be switch from the high voltage level (e.g., VDD) to the low voltage level (e.g., to 0 volts) in order to turn on the reset transistor 132 and pull up the voltage level on the sense node 135. During this pre-charge operation, the specific wordline 123 connected to the gate of the select transistor 150 of the cell can be maintained at the low voltage level (e.g., at 0 volts) such that the select transistor 150 is off. Once the sense node 135 is pre-charged, RST can be switched back to the high voltage level so as to turn off the reset transistor 132 and a light sensing operation can be performed by the pixel 130. Specifically, the specific bitline 121 for the specific column can connected to ground (e.g., through a low resistance path) and the voltage level on the second adjustable voltage rail 139 can again be set at a read voltage (Vread) level. As mentioned above, Vread can be lower than VDD (e.g., by 30-70%) and the optimal level for Vread can be predetermined depending upon the type of NVM in the cell. The photodiode 131 can then be exposed to light resulting in a second data value being output on the sense node 135 (see FIG. 8). Specifically, an analog light intensity value sensed by the photodiode 131 is represented by a voltage signal that is output on the sense node 135 and, thereby applied to the gate of the amplifying transistor 133. The second adjustable voltage rail 139 can be set at the high voltage level (e.g., VDD). Next, the specific wordline 123 for the specific row connected to the cell can be activated (i.e., switched from the low voltage level to the high voltage level), thereby turning on the select transistor 150 of the specific cell 101, and a given electrical parameter (e.g., a bitline voltage or bitline current) on a specific bitline 121 for the specific column can be sensed (e.g., using the TIA 180 connected to that specific bitline). In this case, flow of current between the second adjustable voltage rail 139 and the bitline 121 through the amplifying transistor 133 will be a function of both the first data value X, which is stored in the data storage node 140 (i.e., the gate of the amplifying transistor 133), and the second data value W, which was output on the sense node 135 and applied to the gate of the amplifying transistor 133. Thus, any change in the electrical parameter (as sensed by the TIA) due to current flow through the amplifying transistor 133 will be indicative of the product of the first data value and the second data value.

Figure 9:
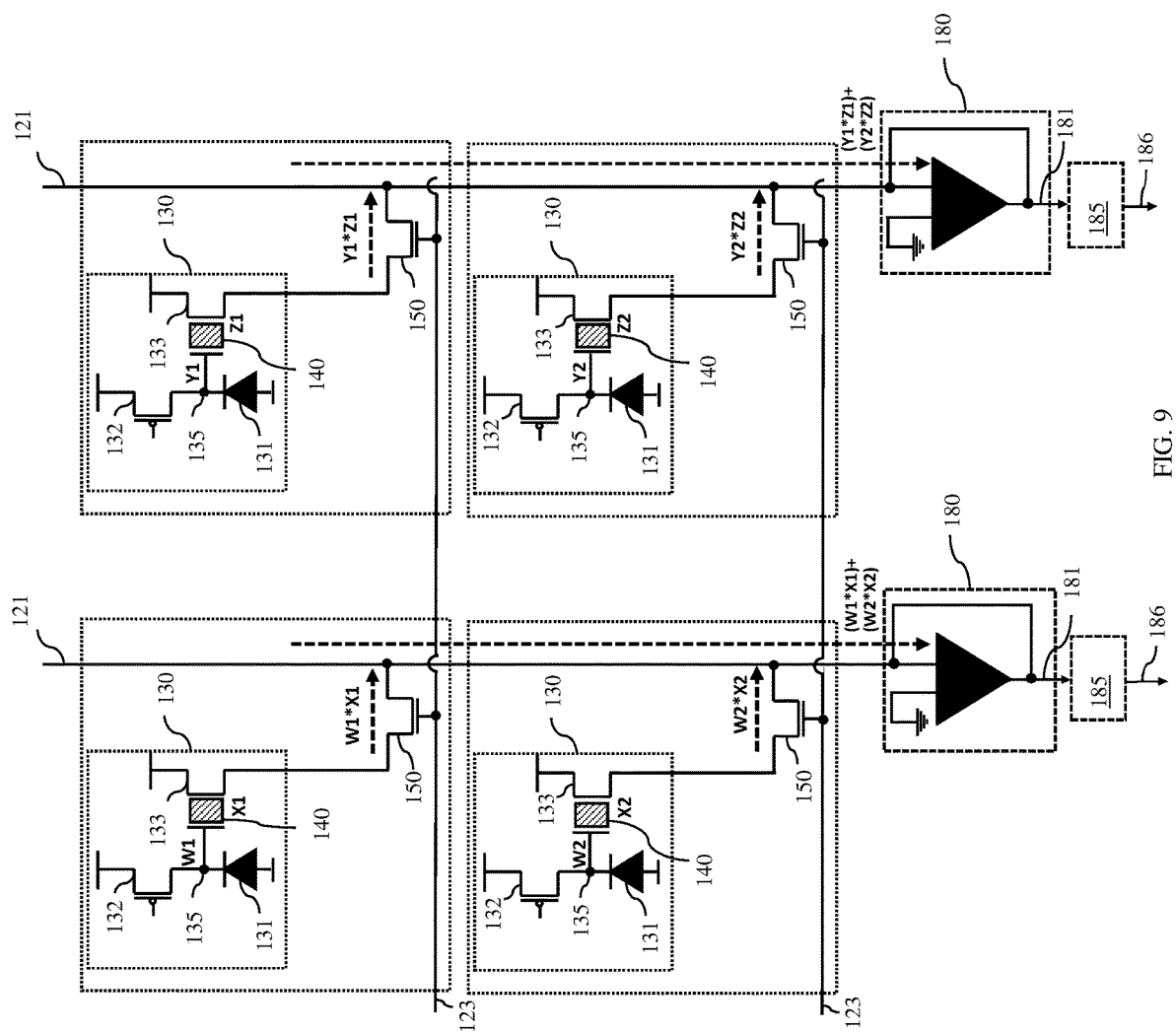
FIG. 9 is a schematic diagram illustrating an array of integrated pixel and three-terminal NVM cell and functional computing operations being concurrently performed by multiple cells in each column.

Optionally, multiple cells in multiple columns and rows can be concurrently operated in the functional compute mode for a cognitive computing operation (e.g., during computation of a cognitive neural network (NN). In this case, all of the cells in all of the columns and rows could be concurrently operated in the functional compute mode or some lesser number of cells in the columns or rows could be concurrently operated in the functional compute mode. For illustration purposes, FIG. 9 shows concurrent operation of four cells in the functional compute mode and, specifically, two per column and two per row. To perform such a cognitive computing operation, binary weight values for the cognitive computing operation can be stored (as the first data values) in the data storage nodes 140. The first data values stored in the data storage nodes 140 of the cells 101 in the first column are represented by X1 and X2, respectively. The first data values stored in the data storage nodes 140 in the cells 101 in the second column are represented by Z1 and Z2, respectively. The sense nodes 135 of the pixels 130 in the cells 101 can be concurrently pre-charged. That is, the RST signal applied to the gates of the reset transistors 132 in the multiple cells 101 can be switched to the low voltage level thereby turning on those reset transistors 132 (while the select transistors 150 remain in an OFF state) and pulling up the sense nodes 135 in the cells to the high voltage level. Once the sense nodes 135 are pre-charged, the RST signal can be switched back to the high voltage level, turning off the reset transistors 132. Next, light sensing processes can be performed using the pixels 130 in the cells 101. Specifically, the bitlines for columns can connected to ground (e.g., through low resistance paths) and the voltage level on each second adjustable voltage rail 139 can again be set at the read voltage (Vread) level. The photodiodes 131 of the pixels 130 in the cells 101 can then be exposed to light, which result in second data values being output on the sense nodes 135 of the cells. Specifically, analog light intensity values sensed by the photodiodes 131 are represented by voltage signals (i.e., the second data values) that are output on the sense nodes 135 and, thereby applied to the gates of the amplifying transistors 133. The second data values on the sense nodes 135 of the pixels 130 of the cells 101 in the first column are represented by W1 and W2, respectively. The second data values on the sense nodes 135 of the pixels 130 of the cells 101 in the second column are represented by Y1 and Y2, respectively. These second data values can be the activation values for the cognitive computing operation. Additionally, the wordlines 123 for the rows can be activated (i.e., switched from the low voltage level to the high voltage level), thereby turning on the select transistors 150 of the cells 101, and changes in a given electrical parameter (e.g., a bitline voltage or bitline current) on each of the bitlines can be sensed (e.g., using the TIAs 180 connected to the bitlines). In this case, flow of current through each cell 101 between the second adjustable voltage rail 139 and the bitline for the column that contains the cell will be a function of both the first data value and the second data value. Thus, any changes in the given electrical parameter on each bitline 121 for each column (as indicated by the output of the TIA 180 for the column) will be based on the first and second data values in each cell of that column. Specifically, for cognitive computing operations, when multiple cells in the same specific column are concurrently selectively operated in the functional computing mode and, optionally, when parallel processing is performed in multiple columns, the total change in the given electrical parameter on each specific bitline for each specific column in response to the cells in that specific column concurrently being operated in the functional computing mode will be indicative of the result of a dot product computation (i.e., will be indicative of the sum of the products of the first data value and the second data value from each selected cell in the specific column). For example, as illustrated in FIG. 9, the total change in the given electrical parameter on the bitline of the first column when the two cells therein are in the functional computing mode will be approximately equal to (W1*X1)+(W2*X2), whereas the total change in the given electrical parameter on the bitline of the second column when the two cells therein are in the functional computing mode will be approximately equal to (Y1*Z1)+(Y2*Z2).

It should be understood that the integrated pixel and three-terminal NVM cell 101 shown in FIG. 1 is offered for illustration purposes and is not intended to be limiting. FIGS. 10A-10F are schematic drawings illustrating alternative embodiments for an integrated pixel and three-terminal NVM cell 101A-101F, respectively. Any of these alternative embodiments could replace the cells 101 shown in FIG. 1.

Each integrated pixel and three-terminal NVM cell 101A-101F can include a select transistor 150 and pixel 130, as discussed above. However, in some embodiments, the integrated pixel and three-terminal NVM cell could include one or more additional transistors to enhance performance. See FIG. 10A and the integrated pixel and three-terminal NVM cell 101A, which includes a switch 136 (e.g., an additional NFET, also referred to as an isolation FET) between the sense node 135 and the gate of the amplifying transistor 133. Such a switch 36 can be used to control current flow to the gate of the amplifying transistor until the sensing process by the photodiode is complete. See also FIG. 10B and the integrated pixel and three-terminal NVM cell 101B that includes the switch 136 (as described above) and another additional NFET 151 provided for improved performance. This additional NFET 151 has both a drain region and a gate electrically connected to the junction between the amplifying transistor 133 and the select transistor 150 and further has a source region connected to ground.

Figure 10A:
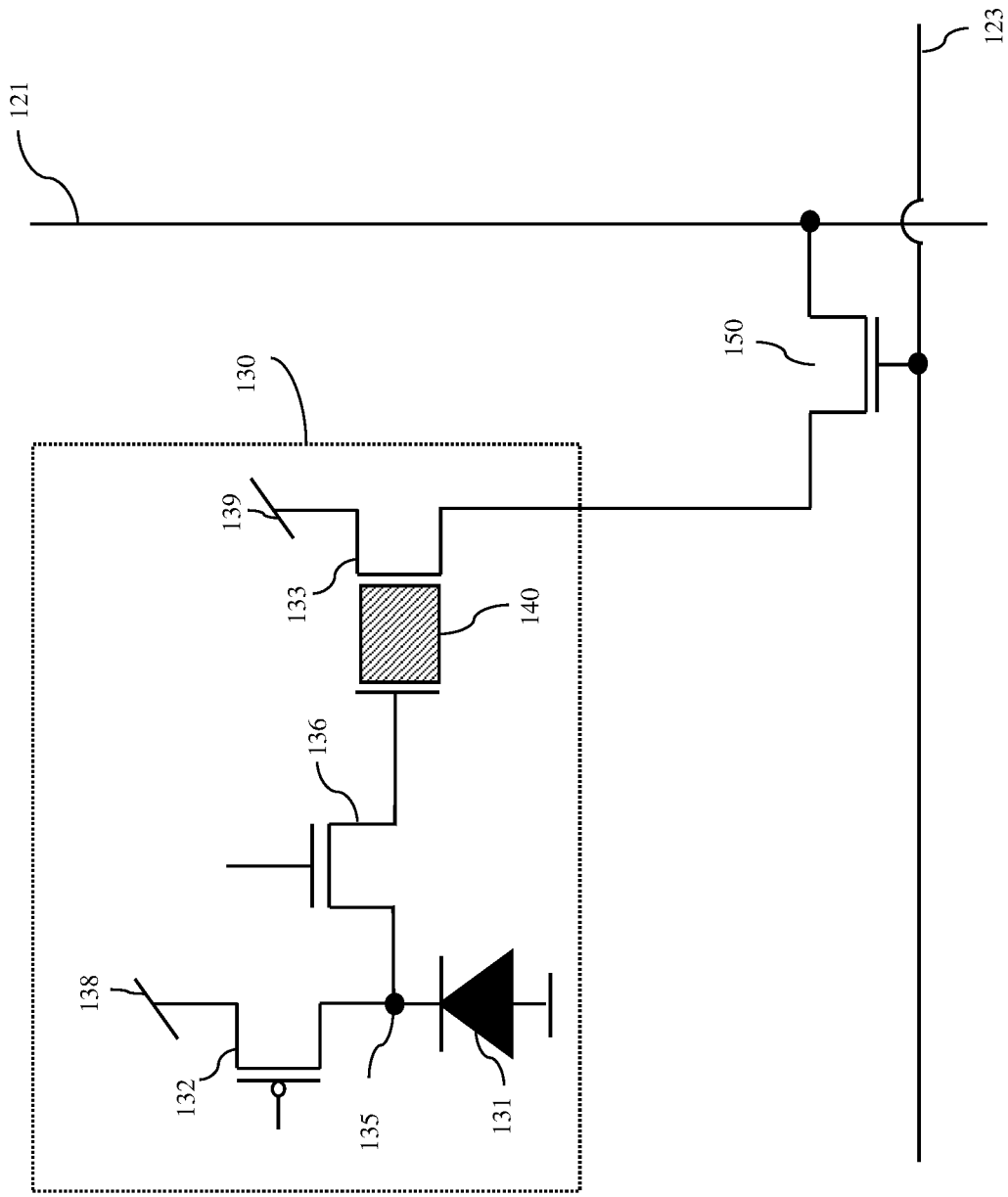
FIGS. 10A-10F are schematic diagrams illustrating alternative embodiments, respectively, of an integrated pixel and three-terminal NVM cell that could be incorporated into the array of FIG. 1.
Figure 10B:
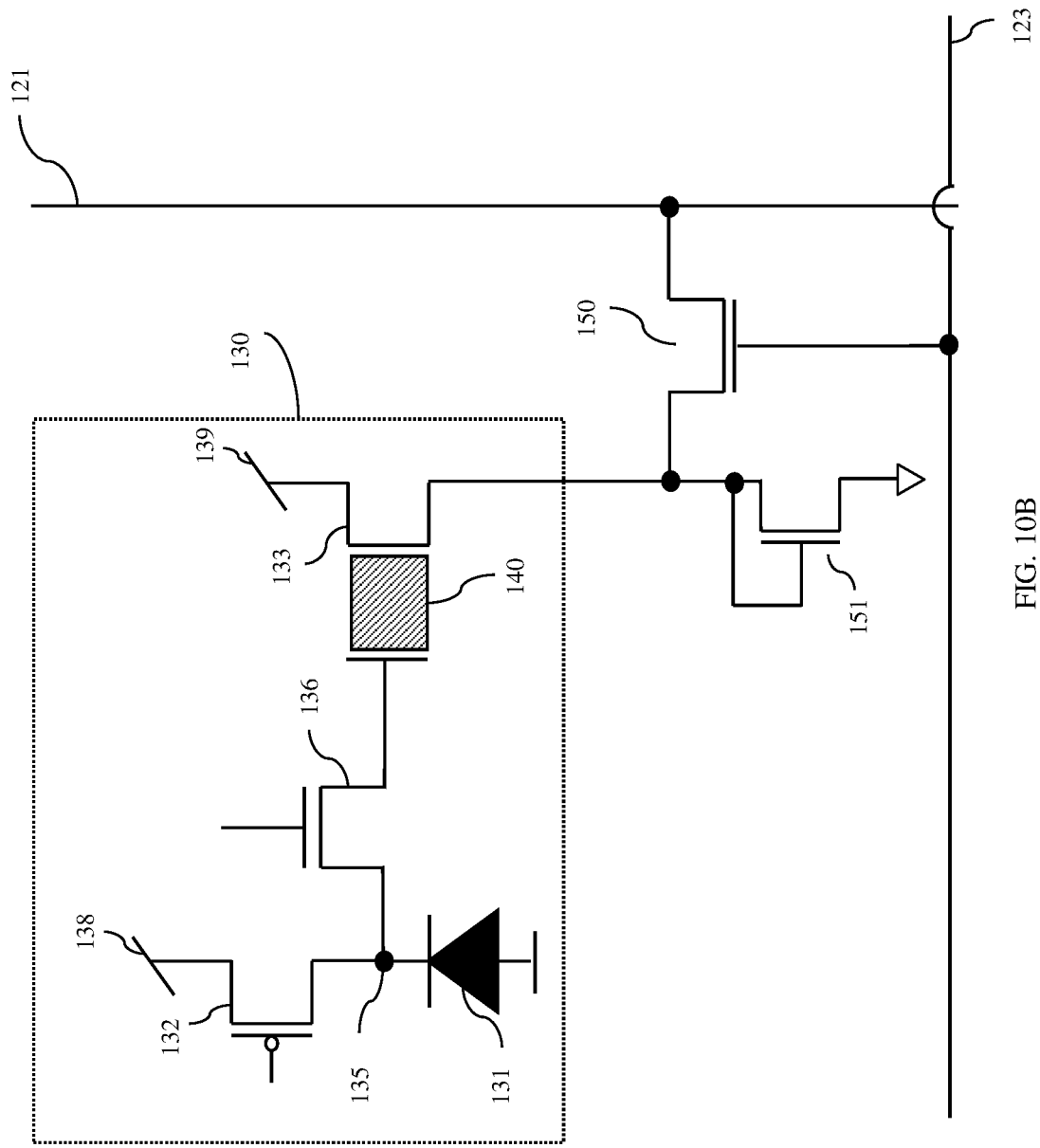
Figure 10C:
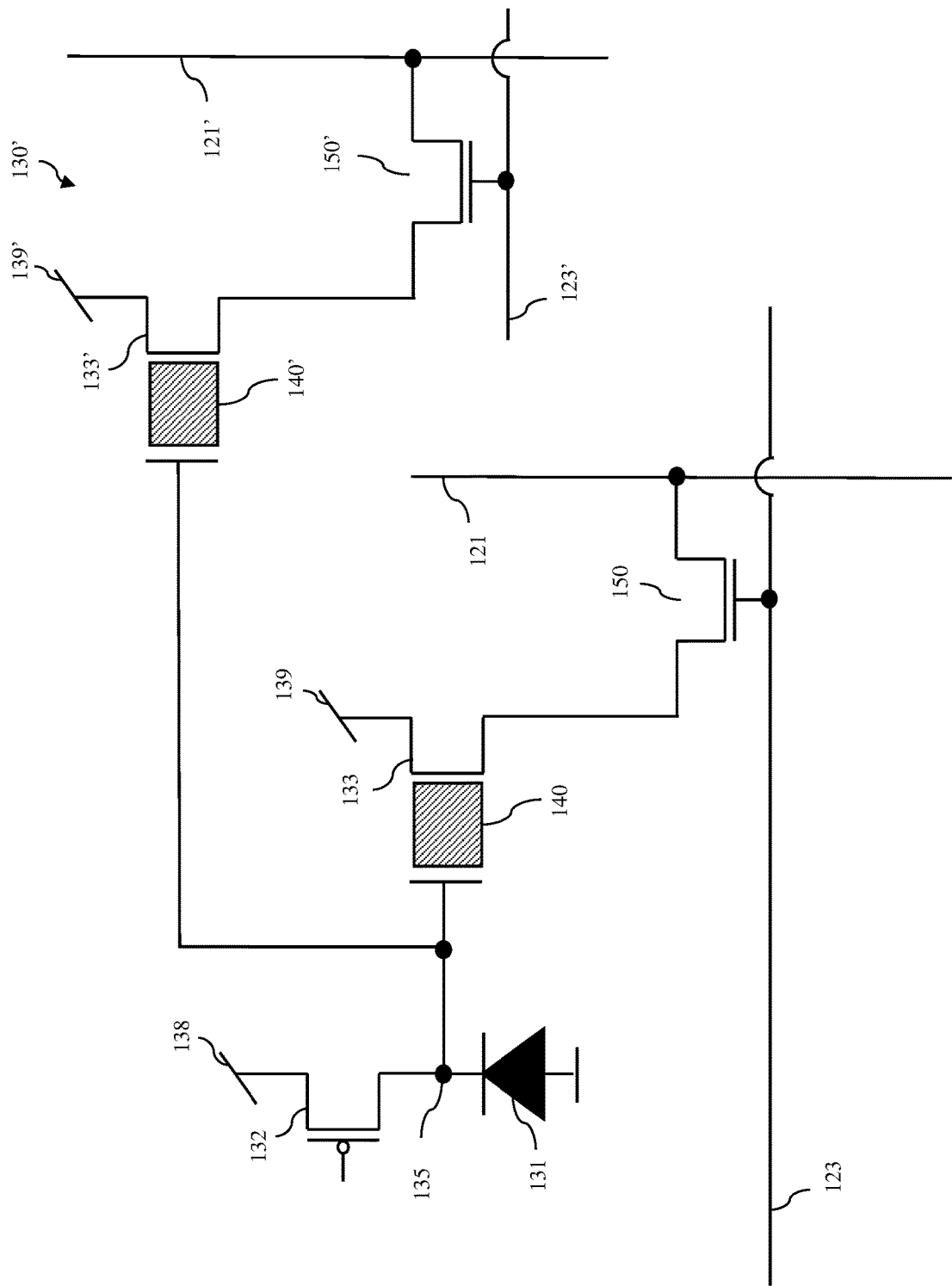
Figure 10D:
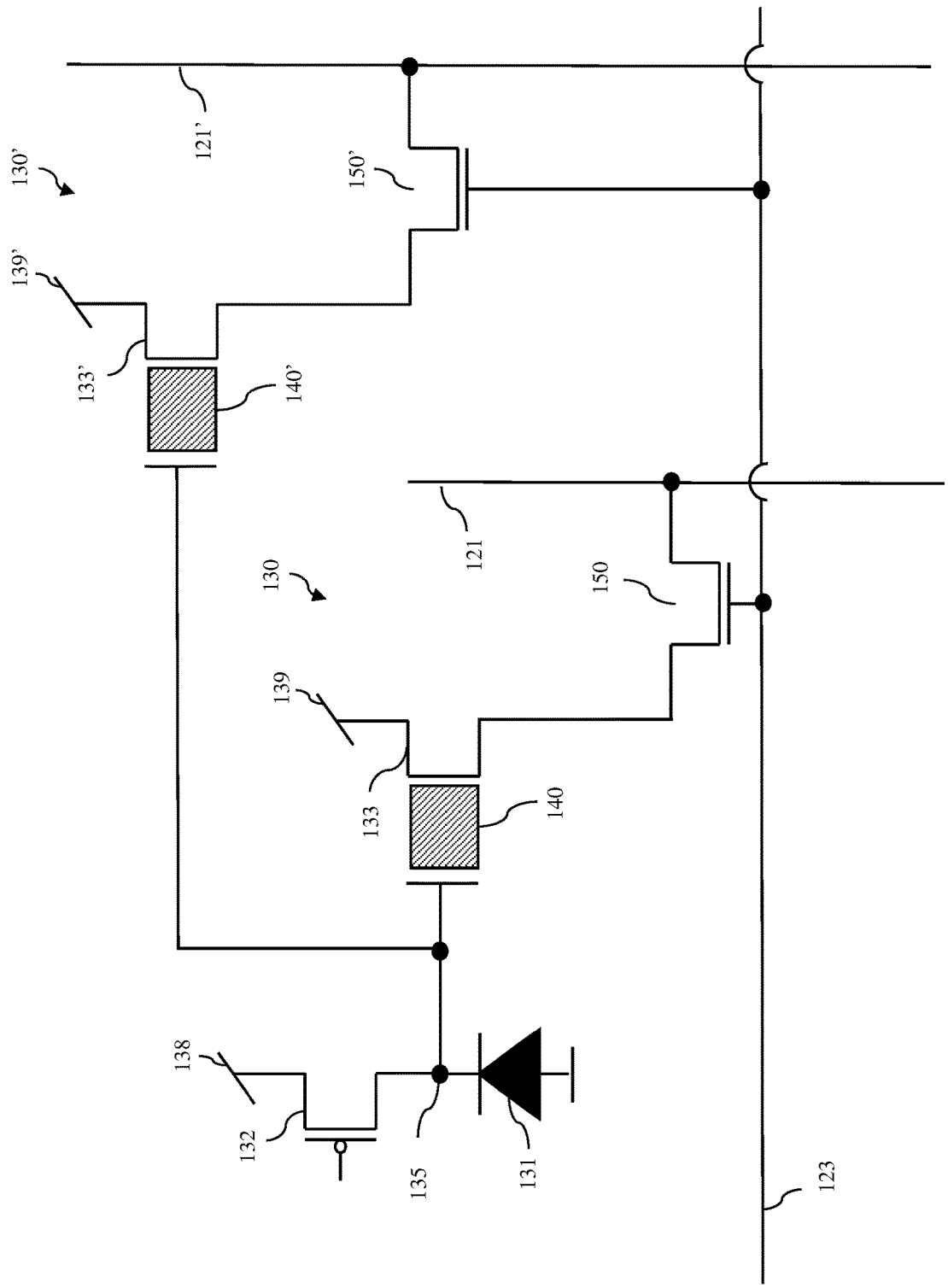
Figure 10E:
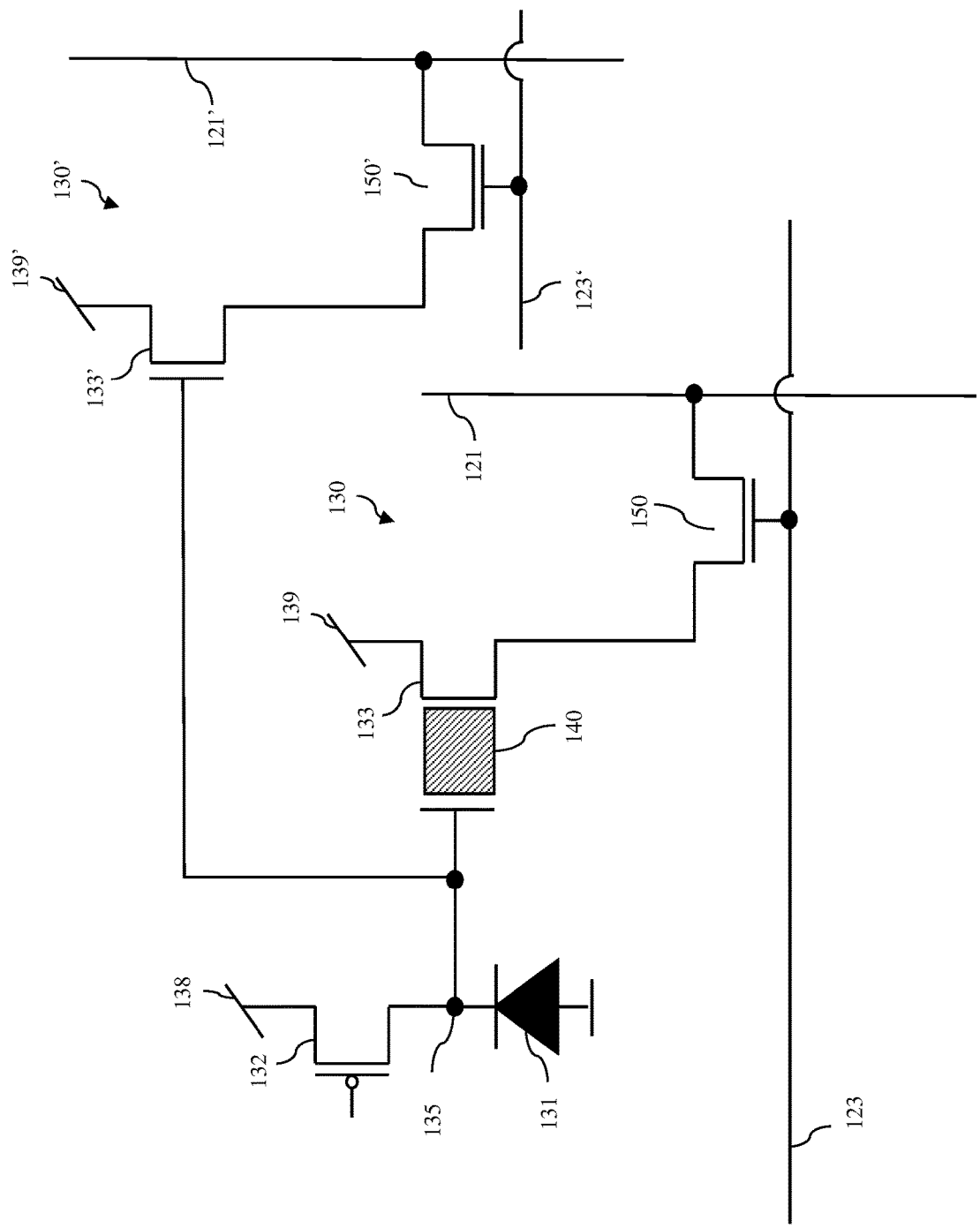
Figure 10F:
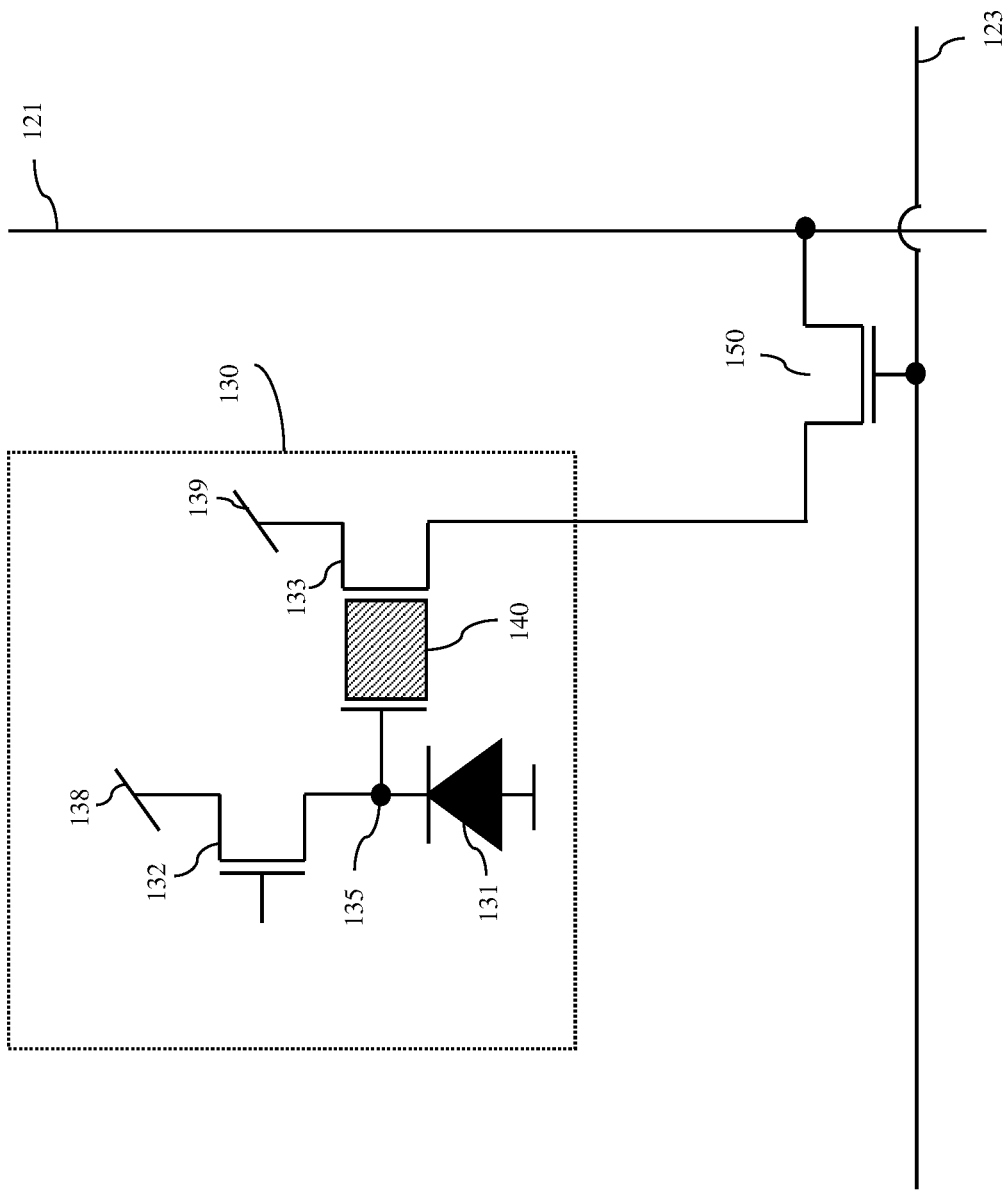

In some embodiments, the integrated pixel and three-terminal NVM cell could also include an additional amplifying transistor configured as a three-terminal NVM and an additional select transistor. See FIG. 10C and the integrated pixel and dual-NVM cell 101C. The integrated pixel and dual-NVM cell 101C can include the pixel 130 (as described above) plus an additional amplifying transistor 133' and an additional select transistor 150'. The additional amplifying transistor 133' can be another three-terminal NVM device and it's gate (i.e., it's data storage node 140') can also be electrically connected to the sense node 135. The additional amplifying transistor 133' and the additional select transistor 150' can be electrically connected in series between an additional adjustable voltage rail 139' and an additional bitline 121' for the column. The additional select transistor 150' can have a gate that is electrically connected to an additional wordline 123' for the row. In this case, an additional first data value can be stored in the additional data storage node 140' (in the same manner as described above with respect to the data storage node 140). Thus, the integrated pixel and dual-NVM cell 101C can similarly be employed for functional computing operations. However, in this case, any change in the bitline voltage on one bitline 121 for the column (as indicated by a TIA connected to that bitline) is a function of both the second data value output from the photodiode 131 onto the sense node 135 and the first data value stored on the data storage node 140 and any change in the bitline voltage on the additional bitline 121' for the column (as indicated by an additional TIA (not shown) which is connected to that bitline 121') is a function of both the second data value output from the photodiode 131 onto the sense node 135 and the additional first data value stored on the additional data storage node 140'. It should be noted that the integrated pixel and dual-NVM cell 101C of FIG. 10C is not intended to be limiting. Other integrated pixel and dual-NVM cells could also be incorporated into an array. For example, see the integrated pixel and dual-NVM cell 101D of FIG. 10D, which is configured essentially the same as the integrated pixel and dual-NVM cell 101C of FIG. 10C except that the same wordline is connected to both of the select transistors 150 and 150'. Thus, in the cell 101C of FIG. 10C, write, read and functional computing operations using the different data storage nodes 140 and 140' can be performed concurrently or separately because of the two wordlines 123 and 123'. In the cell 101D of FIG. 10D, space is saved by not including the additional wordline 123' but as a result write, read and functional computing operations using the different data storage nodes 140 and 140' can only be performed concurrently.

In some embodiments, the integrated pixel and three-terminal NVM cell could include additional transistor in order to enable a pixel-only read operation. See FIG. 10E and the integrated pixel and three-terminal NVM cell 101E. This integrated pixel and three-terminal NVM cell 101E can include an additional amplifying transistor 133', which is a conventional NFET as opposed to being configured as an NVM device and which has a gate connected to the sense node 135. This integrated pixel and three-terminal NVM cell 101E can also include additional select transistor 150' (another NFET). The additional amplifying transistor 133' and the additional select transistor 150' can be electrically connected in series between an additional voltage rail 139' and an additional bitline 121' for the column. The additional select transistor 150' can have a gate, which is connected to an additional wordline 123' for the row (as shown). In this case, a read operation of the stored first data value or a functional computing operation based on both the stored first data value and the sensed second data value could be performed at the same time or at a different time than a read operation of the sensed second data value only. Alternatively, the gates of the select transistor 150 and the additional select transistor 150' could be connected to the same wordline (not shown). In this case, space is saved by not including the additional wordline 123' but as a result reading of the sensed second data value only can only be performed concurrent with other cell operations.

In some embodiments, the conductivity type of one or more of the transistors in the cell may be different as compared to in the embodiments described above. For example, in each of the above-described embodiments, the reset transistor 132 of the pixel 130 is a PFET; however, alternatively, this reset transistor 132 could be an NFET (see FIG. 10F and the integrated pixel and three-terminal NVM cell 101F). It should be understood that an NFET reset transistor 132 would be turned off by applying 0V to its gate. The advantage of using such an NFET reset transistor is saving of the gate activation energy, since for the majority of time the reset transistor is in the OFF state.

Figure 11:
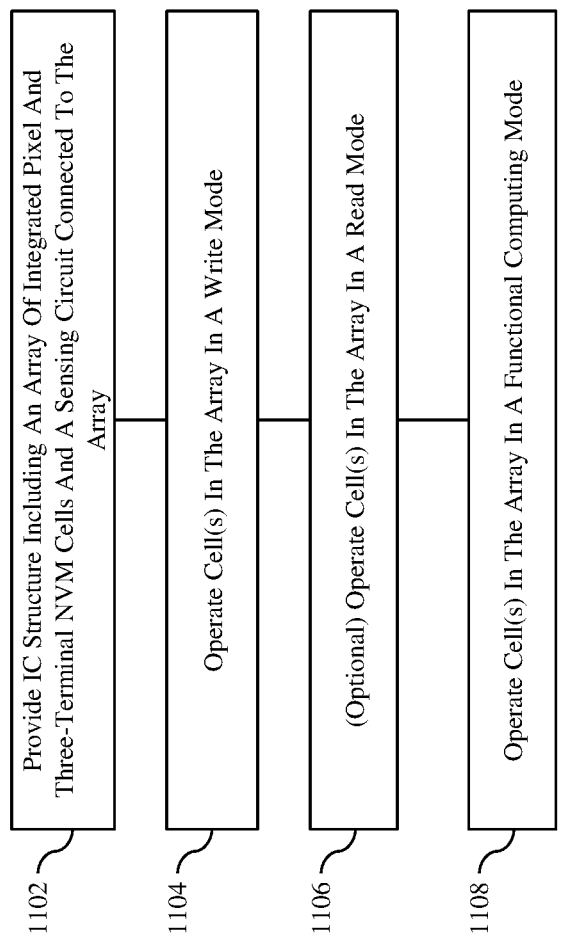
FIG. 11 is a flow diagram illustrating method embodiments for operating an integrated pixel and three-terminal NVM cell and for operating an array of such cells (e.g., to perform deep in-sensor, in-memory computing).

Referring to the flow diagram of FIG. 11, also disclosed herein are associated method embodiments. Specifically, a disclosed method can include providing an integrated circuit (IC) structure 100 (i.e., a processing chip), as described in detail above and illustrated in FIG. 1, that incorporates an array 110 of integrated pixel and three-terminal non-volatile memory (NVM) cells 101 and a sensing circuit connected to the array 110 (see process step 1102).

The method can further include selectively operating the cells in that array in a write mode, a read mode and a functional computing mode (see process steps 1104-1106).

Specifically, referring to FIG. 1 in combination with FIG. 11, operating a specific cell 101 in a specific row and a specific column in a write mode at process step 1104 can include turning on the reset transistor 132 and the select transistor 150 of the specific cell 101 and applying specific bias conditions to the first adjustable voltage rail 138, the second adjustable voltage rail 139 and a specific bitline 121 for the specific column in order to store a first data value in the data storage node 140 of the three-terminal NVM device (i.e., in the gate of the amplifying transistor 133) of the specific cell 101. Specifically, the gate of the three-terminal NVM device can be biased by the first adjustable voltage rail through the reset transistor (which is in the ON state). One source/drain region of the three-terminal NVM device can be biased by the second adjustable voltage rail. The other source/drain region of the three-terminal NVM device can be biased by the specific bitline for the specific column through the select transistor (which is also in the ON state). It should be understood that the specific bias conditions will vary depending upon the desired stored data value and on the type and configuration of the two-terminal non-volatile memory device. For example, see the detailed discussions of FIGS. 2A-2B, 3A-3B, 4A-4B and 5A-5B above Operating a specific cell 101 in a specific row and a specific column in the read mode at process step 1106 can include connecting the specific bitline 121 for the specific column containing the specific cell to ground (e.g., through a low resistance path), setting the first adjustable voltage rail 138 to 0 volts and applying a read voltage (Vread) to the second adjustable voltage rail 139 (i.e., setting the second adjustable voltage rail 139 to a Vread level). Vread can be lower than VDD (e.g., by 30-70%) and the optimal level for Vread can be predetermined depending upon the type of NVM in the cell. The reset transistor 132 and the select transistor 150 of the specific cell 101 can then be turned on and any change in a given electrical parameter (e.g., bitline voltage or bitline current) on the specific bitline 121 for the specific column can be sensed (e.g., using the TIA 180 connected to the specific bitline) in order to determine the first data value stored in the data storage node 140. For example, see the detailed discussion of FIG. 6 above.

Operating a specific cell 101 in a specific column and a specific row in the functional computing mode at process step 1108 can include initially pre-charging the sense node 135 of the specific cell 101. The sense node 135 can be pre-charged by setting the first adjustable voltage rail 138 to a high positive voltage (e.g., VDD) and turning on the reset transistor 132, while keeping the select transistor 150 turned off, so as to pull up the voltage level on the sense node. For example, see the detailed discussion of FIG. 7 above. Operating the specific cell 101 in the functional computing mode at process step 1108 can further include: following pre-charging of the sense node 135, turning off the reset transistor 132, connecting a specific bitline 121 for the specific column to ground (e.g., through a low resistance path), applying the read voltage (Vread) to the second adjustable voltage rail 139 and performing a light sensing process using the pixel 130. Performing the light sensing process can include: exposing the photodiode 131 of the specific cell 101 to light resulting in a second data value being output on the sense node 135; turning on the select transistor 150 for the specific cell 101; and then sensing any change in a given electrical parameter (e.g., bitline voltage or bitline current) on the specific bitline 121 (e.g., using the TIA 180 connected to the specific bitline). See the detailed discussion of FIG. 8 above. Any change in the given electrical parameter on the specific bitline 121 in response to the above-described functional computing process steps will be indicative of a product of the first data value stored in the data storage node 140 and the second data value captured by the photodiode 131 and output on the sense node 135. Furthermore, the total change in the given electrical parameter on the specific bitline in response to multiple cells in the same specific column concurrent operating the functional computing mode will be indicative of a result of a dot product computation. See the detailed discussion of FIG. 9 above. Thus, the method can be employed for deep in-sensor, in-memory computing of applications that require dot product computations (e.g., for deep in-sensor, in-memory computing of neural networks).

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An integrated pixel and memory cell comprising:
    a select transistor; and
    a pixel comprising:
        a reset transistor;
        a photodiode connected in series with the reset transistor;
        a sense node at a junction between the reset transistor and the photodiode; and
        an amplifying transistor connected in series with the select transistor, wherein the amplifying transistor has a gate connected to the sense node and wherein the amplifying transistor comprises a three-terminal non-volatile memory device with the gate being a data storage node.

2. The integrated pixel and memory cell of claim 1, wherein the amplifying transistor comprises any of a floating gate field effect transistor, a charge trap field effect transistor and a ferroelectric field effect transistor.

3. The integrated pixel and memory cell of claim 1,
    wherein the cell is operable in a write mode, a read mode and a functional computing mode,
    wherein, during the write mode, a first data value is stored in the data storage node,
    wherein, during the read mode, the first data value is read from the cell, and
    wherein, during the functional computing mode, the photodiode performs a light sensing process resulting in a second data value on the sense node and an output read from the cell is dependent on the first data value and the second data value.

4. The integrated pixel and memory cell of claim 1, further comprising a switch connected to the gate of the amplifying transistor and to the sense node.

5. The integrated pixel and memory cell of claim 1, further comprising an additional transistor connected to a junction between the amplifying transistor and the select transistor.

6. The integrated pixel and memory cell of claim 1,
    wherein the reset transistor is connected in series between a first adjustable voltage rail and the photodiode,
    wherein the amplifying transistor and the select transistor are connected in series between a second adjustable voltage rail and a bitline for a column in an array of integrated pixel and memory cells, and
    wherein a gate of the select transistor is connected to a wordline for a row in the array.

7. The integrated pixel and memory cell of claim 6, further comprising an additional amplifying transistor and an additional select transistor connected in series between an additional adjustable voltage rail and an additional bitline for the column, wherein the additional amplifying transistor comprises an additional three-terminal non-volatile memory device, wherein a gate of the additional amplifying transistor is connected to the sense node and wherein a gate of the additional select transistor is connected to an additional wordline for the row.

8. The integrated pixel and memory cell of claim 6, further comprising an additional amplifying transistor and an additional select transistor connected in series between an additional adjustable voltage rail and an additional bitline for the column, wherein the additional amplifying transistor comprises an additional three-terminal non-volatile memory cell, wherein a gate of the additional amplifying transistor is connected to the sense node and wherein a gate of the additional select transistor is connected to the wordline for the row.

9. The integrated pixel and memory cell of claim 6, further comprising an additional amplifying transistor and an additional select transistor connected in series between an additional adjustable voltage rail and an additional bitline for the column, wherein the additional amplifying transistor comprises a conventional field effect transistor, wherein a gate of the additional amplifying transistor is connected to the sense node and wherein a gate of the additional select transistor is connected a wordline for the row.

10. An integrated circuit structure comprising:
    an array of integrated pixel and memory cells;
    bitlines connected to columns of the cells in the array; and
    wordlines connected to rows of cells in the array,
    wherein each cell comprises:
        a select transistor having a gate connected to a wordline for a row; and
        a pixel comprising:

a reset transistor;
a photodiode, wherein the reset transistor is connected in series between a first adjustable voltage rail and the photodiode;
a sense node at a junction between the reset transistor and the photodiode; and
an amplifying transistor, wherein the amplifying transistor and the select transistor are connected in series between a second adjustable voltage rail and a bitline for a column, wherein the amplifying transistor has a gate connected to the sense node and wherein the amplifying transistor comprises a three-terminal non-volatile memory device with the gate being a data storage node.

11. The integrated circuit structure of claim 10, wherein the amplifying transistor comprises any of a floating gate field effect transistor, a charge trap field effect transistor and a ferroelectric field effect transistor.

12. The integrated circuit structure of claim 10, further comprising a sensing circuit comprising transimpedance amplifiers for the columns, respectively, wherein each specific transimpedance amplifier for each specific column has a first input electrically connected to ground, a second input electrically connected to a specific bitline for the specific column and an output electrically connected to the specific bitline for the specific column.

13. The integrated circuit structure of claim 12, the sensing circuit further comprising analog-to-digital converters for the columns, respectively, wherein each specific analog-to-digital converter for each specific column is electrically connected to the output of the specific transimpedance amplifier.

14. The integrated circuit structure of claim 10, wherein each one of the cells is operable in a write mode, a read mode and a functional computing mode.

15. The integrated circuit structure of claim 14, wherein, during the write mode in a specific cell in a specific row and a specific column, the reset transistor and the select transistor of the specific cell are turned on and specific bias conditions are applied to the first adjustable voltage rail, the second adjustable voltage rail and a specific bitline for the specific column in order to store a first data value in the data storage node of the three-terminal non-volatile memory device, wherein the specific bias conditions vary depending upon a desired stored data value and on a type and configuration of the three-terminal non-volatile memory device.

16. The integrated circuit structure of claim 15, wherein, during the functional computing mode in the specific cell,
the first adjustable voltage rail is set at a high positive voltage level and the reset transistor is turned on, while the select transistor is turned off, in order to pre-charge the sense node, and
following pre-charging of the sense node, the reset transistor is turned off, the second adjustable voltage rail is set at a read voltage level, a specific bitline for the specific column is connected to ground and the pixel performs a light sensing operation, wherein, during the light sensing operation, the photodiode is exposed to light resulting in a second data value on the sense node, the select transistor is turned on, and an electrical parameter on a specific bitline for the specific column is sensed,
wherein any change in the electrical parameter on the specific bitline is indicative of a product of the first data value and the second data value in the specific cell, and
wherein a total change in the electrical parameter on the specific bitline in response to multiple cells in the specific column concurrently operating in the functional computing mode is indicative of a result of a dot product computation.

17. A method comprising:
providing an integrated circuit structure comprising: an array of integrated pixel and memory cells; bitlines connected to columns of the cells in the array; and wordlines connected to rows of cells in the array, wherein each cell comprises:
a select transistor having a gate connected to a wordline for a row; and
a pixel comprising:
a reset transistor;
a photodiode, wherein the reset transistor is connected in series between a first adjustable voltage rail and the photodiode;
a sense node at a junction between the reset transistor and the photodiode; and
an amplifying transistor, wherein the amplifying transistor and the select transistor are connected in series between a second adjustable voltage rail and a bitline for a column, wherein the amplifying transistor has a gate connected to the sense node and wherein the amplifying transistor comprises a three-terminal non-volatile memory device with the gate being a data storage node; and
operating any of the cells in the array in any of a write mode, a read mode, and a functional computing mode.

18. The method of claim 17, wherein the amplifying transistor comprises any of a floating gate field effect transistor, a charge trap field effect transistor and a ferroelectric field effect transistor.

19. The method of claim 18, wherein operating a specific cell in a specific row and a specific column in the write mode comprises:
turning on the reset transistor and the select transistor of the specific cell; and
applying specific bias conditions to the first adjustable voltage rail, the second adjustable voltage rail and a specific bitline for the specific column in order to store a first data value in the data storage node of the three-terminal non-volatile memory device of the specific cell, wherein the specific bias conditions vary depending upon a desired stored data value and on a type and configuration of the three-terminal non-volatile memory device.

20. The method of claim 19, wherein operating a specific cell in a specific row and a specific column in the functional computing mode comprises:
pre-charging the sense node by applying a high positive voltage to the first adjustable voltage rail and turning on the reset transistor when the select transistor is turned off; and
following pre-charging of the sense node, turning off the reset transistor, applying a read voltage (Vread) to the second adjustable voltage rail, connecting a specific bitline for the specific column to ground and performing a light sensing process using the pixel, wherein the light sensing processes comprises exposing the photodiode to light resulting in a second data value on the sense node, turning on the select transistor, and sensing an electrical parameter on the specific bitline for the specific column,
wherein any change in the electrical parameter on the specific bitline is indicative of a product of the first data value and the second data value in the specific cell, and wherein a total change in the electrical parameter on the specific bitline in response multiple cells in the specific column concurrently operating in the functional computing mode is indicative of a result of a dot product computation.

* * * * *